United States Patent
Kim et al.

(10) Patent No.: US 11,812,651 B2
(45) Date of Patent: Nov. 7, 2023

(54) FLEXIBLE DISPLAY DEVICE WITH ANTI-REFLECTION LAYER AND METHOD FOR MANUFACTURING SAME

(71) Applicant: Samsung Display Co., LTD., Yongin-si (KR)

(72) Inventors: Tae Hyun Kim, Seoul (KR); Jonghyun Choi, Seoul (KR); Youngwoo Park, Yongin-si (KR); Jiryun Park, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 102 days.

(21) Appl. No.: 17/185,380

(22) Filed: Feb. 25, 2021

(65) Prior Publication Data

US 2022/0020823 A1 Jan. 20, 2022

(30) Foreign Application Priority Data

Jul. 14, 2020 (KR) ........................ 10-2020-0086862

(51) Int. Cl.
*H10K 59/40* (2023.01)
*H10K 50/86* (2023.01)
(Continued)

(52) U.S. Cl.
CPC ........... *H10K 59/40* (2023.02); *G06F 3/0412* (2013.01); *H10K 50/844* (2023.02); *H10K 50/86* (2023.02);
(Continued)

(58) Field of Classification Search
CPC ...... G09G 3/32; G09G 3/3258; G09G 3/3266; G09G 3/3275; G09G 2310/08; H01L 51/5262; H01L 51/5281; H01L 2227/323; H01L 27/3244; G02F 1/1345; H05K 1/14; G09F 9/301; G09F 9/32; H10K 59/40; H10K 50/844; H10K 50/86; H10K 71/00;
(Continued)

(56) References Cited

U.S. PATENT DOCUMENTS 10,319,939 B2  6/2019 Seong et al.
10,748,973 B2  8/2020 Han et al.
(Continued)

FOREIGN PATENT DOCUMENTS

KR 10-2018-0059645  6/2018
KR 10-2020-0019301  2/2020

OTHER PUBLICATIONS

Extended European search report for European Patent Application or Patent No. 21173176.5 dated Nov. 25, 2021.

*Primary Examiner* — John P. Dulka
(74) *Attorney, Agent, or Firm* — KILE PARK REED & HOUTTEMAN PLLC

(57) ABSTRACT

A method for manufacturing a display device includes preparing a display panel that includes a first area, a bending area extending from the first area, and a second area extending from the bending area, attaching an anti-reflection layer to the display panel, removing a first removal section of a first releasing film disposed on the anti-reflection layer, the first removal section overlapping the second area of the display panel in a plan view, and providing a cover tape onto a first section of the anti-reflection layer that overlaps the second area of the display panel in a plan view.

19 Claims, 20 Drawing Sheets

(51) Int. Cl.
  *H10K 59/12* (2023.01)
  *G06F 3/041* (2006.01)
  *H10K 50/844* (2023.01)
  *H10K 71/00* (2023.01)
  *G09G 3/3258* (2016.01)
  *G09G 3/3266* (2016.01)
  *G09G 3/3275* (2016.01)

(52) U.S. Cl.
  CPC ........... *H10K 71/00* (2023.02); *G09G 3/3258* (2013.01); *G09G 3/3266* (2013.01); *G09G 3/3275* (2013.01); *G09G 2310/08* (2013.01); *H10K 59/1201* (2023.02)

(58) Field of Classification Search
  CPC .. H10K 59/1201; H10K 50/841; H10K 50/85; H10K 59/12; H10K 59/00; G06F 3/0412
  See application file for complete search history.

(56) References Cited

U.S. PATENT DOCUMENTS

| | | | |
|---|---|---|---|
| 2004/0156105 A1* | 8/2004 | Trapani | G02B 5/3083 359/489.03 |
| 2015/0209898 A1* | 7/2015 | Kim | B23K 26/0006 65/355 |
| 2018/0219051 A1* | 8/2018 | Ghosh | H01L 51/56 |
| 2020/0052248 A1 | 2/2020 | Cho et al. | |
| 2020/0106054 A1* | 4/2020 | Boroson | H01L 27/32 |
| 2020/0152896 A1 | 5/2020 | Jung | |
| 2020/0185641 A1 | 6/2020 | Jeong et al. | |
| 2021/0215857 A1* | 7/2021 | Nichol | G02B 5/30 |
| 2022/0181581 A1* | 6/2022 | Kawamura | G09F 9/00 |
| 2022/0187871 A1* | 6/2022 | Yamazaki | G09G 5/00 |

* cited by examiner

FIG. 6
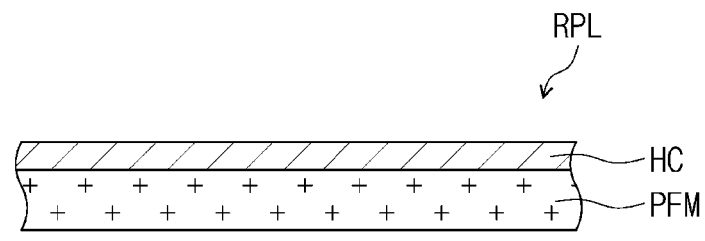
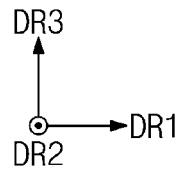
FIG. 7
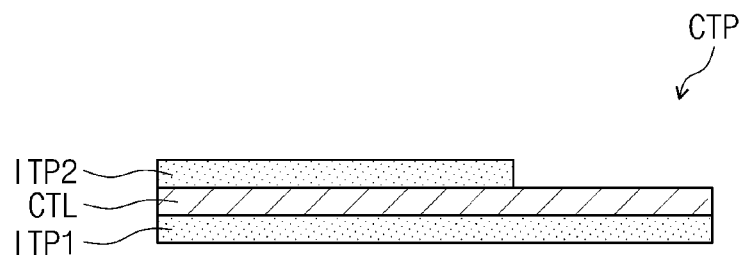
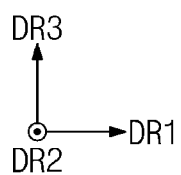

FLEXIBLE DISPLAY DEVICE WITH ANTI-REFLECTION LAYER AND METHOD FOR MANUFACTURING SAME

CROSS-REFERENCE TO RELATED APPLICATION(S)

This U.S. non-provisional patent application claims priority to and the benefit of Korean Patent Application No. 10-2020-0086862 under 35 U.S.C. § 119, filed in the Korean Intellectual Property Office (KIPO) on Jul. 14, 2020, the entire contents of which are incorporated herein by reference.

BACKGROUND

The disclosure relates to a display device and a method for manufacturing same.

Generally, electronic apparatuses that provide a user with an image, such as smart phones, digital cameras, laptop computers, navigation systems, and smart televisions, include a display device for displaying the image. The display device generates an image and provides the generated image to the user through a display screen.

With recent technological development of the display device, a display device including a flexible display panel has been developed. The display panel includes pixels for displaying an image and a driving chip for driving the pixels. The pixels are disposed on a display area of the display panel, and the driving chip is disposed on a non-display area of the display panel surrounding the display area. A bending portion is defined between the driving chip and the display area, and the bending portion is bent so that the driving chip is disposed below the display panel.

SUMMARY

The disclosure provides a display device, in which a cover tape and a window may be easily attached to an anti-reflection layer, and a method for manufacturing same.

An embodiment of the disclosure provides a method for manufacturing a display device, the method including preparing a display panel that includes a first area, a bending area extending from the first area, and a second area extending from the bending area; attaching an anti-reflection layer to the display panel; removing a first removal section of a first releasing film disposed on the anti-reflection layer, the first removal section overlapping the second area of the display panel in a plan view; and providing a cover tape onto a first section of the anti-reflection layer that overlaps the second area of the display panel in a plan view.

The method may further include removing a second removal section of the first releasing film that overlaps both the first area and the bending area of the display panel in a plan view; and providing a window onto a second section of the anti-reflection layer that overlaps the first area of the display panel in a plan view.

The method may further include cutting a first boundary between the first removal section and the second removal section of the first releasing film by irradiating a laser beam to the first boundary.

The cutting of the first boundary may include irradiating the laser beam multiple times onto the first boundary.

The cutting of the first boundary may include not irradiating the laser beam onto the anti-reflection layer.

The first releasing film may have a thickness in a range of about 40 μm to about 60 μm, and the laser beam may have an energy in a range of about 5 W to about 10 W and may be irradiated onto the first boundary at a speed of about 300 mm/sec about 5 times to about 6 times.

The laser beam may include a $CO_2$ laser beam, a UV laser beam, or a femtosecond laser beam.

In a plan view, the first boundary may be spaced apart from a second boundary between the bending area and the second area of the display panel and may overlap the second area of the display panel.

In a plan view, an edge of the cover tape adjacent to the bending area of the display panel may be spaced apart from both a side surface of the second removal section of the first releasing film and the second boundary, the side surface of the second removal section being defined by the first boundary after the first removal section of the first releasing film is removed, and in a plan view, the side surface of the second removal section of the first releasing film may be disposed between the edge of the cover tape and the second boundary.

In a plan view, an edge of the cover tape adjacent to the bending area of the display panel may be spaced apart from the second boundary and may contact a side surface of the second removal section of the first releasing film, the side surface of the second removal section being defined by the first boundary after the first removal section is removed.

The method may further include providing an input sensing part onto the first area of the display panel. The providing of the window may include disposing the window on the input sensing part. The anti-reflection layer may be disposed between the input sensing part and the window on the first area of the display panel and may extend to the bending area and the second area of the display panel.

The attaching of the anti-reflection layer to the display panel may include removing a second releasing film disposed below a first adhesive layer, the first adhesive layer being disposed under the anti-reflection layer; and attaching the anti-reflection layer to the display panel by the first adhesive layer.

The method may further include providing a driving IC (integrated circuit) onto the second area of the display panel. The attaching of the anti-reflection layer may include disposing the anti-reflection layer spaced apart from the driving IC, and the providing of the cover tape may include providing the cover tape on the driving IC.

The method may further include providing a printed circuit board, on which a timing controller is mounted, onto the second area of the display panel so that the printed circuit board is spaced apart from the driving IC. The providing of the cover tape may include disposing the cover tape spaced apart from the timing controller and on a portion of the printed circuit board disposed on the second area of the display panel.

The method may further include bending the bending area of the display panel so that the second area of the display panel is disposed below the first area of the display panel.

In an embodiment, a display device may include a display panel that includes a first area, a bending area extending from the first area, and a second area extending from the bending area; a driving IC (integrated circuit) disposed on the second area of the display panel; an anti-reflection layer disposed on the first area of the display panel, extending to the bending area and the second area of the display panel, and spaced apart from the driving IC; and a cover tape disposed on the driving IC and a first section of the anti-reflection layer that overlaps the second area of the display panel.

An edge of the cover tape adjacent to the bending area of the display panel may be spaced apart from a boundary between the bending area and the second area of the display panel.

The display device may further include a printed circuit board, and a timing controller disposed on the printed circuit board. A portion of the printed circuit board may be spaced apart from the driving IC and disposed on the second area of the display panel, and the cover tape may be spaced apart from the timing controller and disposed on the portion of the printed circuit board disposed on the second area of the display panel.

The display device may further include a panel protective film disposed under the display panel and including an opening portion overlapping the bending area of the display panel; an input sensing part disposed directly on the first area of the display panel; and a window disposed on the input sensing part. The anti-reflection layer may be disposed between the input sensing part and the window on the first area of the display panel and may extend to the bending area and the second area of the display panel.

The first area of the display panel may include a pixel layer, and a thin film encapsulation layer disposed on the pixel layer and overlapping the pixel layer. The anti-reflection layer may be disposed on the thin film encapsulation layer and extend to the bending area of the display panel in a stepped manner.

In an embodiment, a method for manufacturing a display device may include preparing a display panel that includes a first area, a bending area extending from the first area, and a second area extending from the bending area; disposing, on the display panel, a carrier film that includes an anti-reflection layer and a first releasing film disposed on the anti-reflection layer; cutting a first boundary between a first removal section of the first releasing film overlapping the second area of the display panel in a plan view and a second removal section of the first releasing film overlapping both the first area and the bending area of the display panel in a plan view by irradiating a laser beam to the first boundary; removing the first removal section; providing a cover tape onto a first section of the anti-reflection layer that overlaps the second area of the display panel in a plan view; removing the second removal section of the first releasing film; and providing a window onto a second section of the anti-reflection layer that overlaps the first area of the display panel in a plan view.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 6 is a view schematically illustrating a structure of an anti-reflection layer illustrated in FIG. 5;

FIG. 7 is a view schematically illustrating a structure of a cover tape illustrated in FIG. 5;

DETAILED DESCRIPTION OF THE EMBODIMENTS

Figure 1:
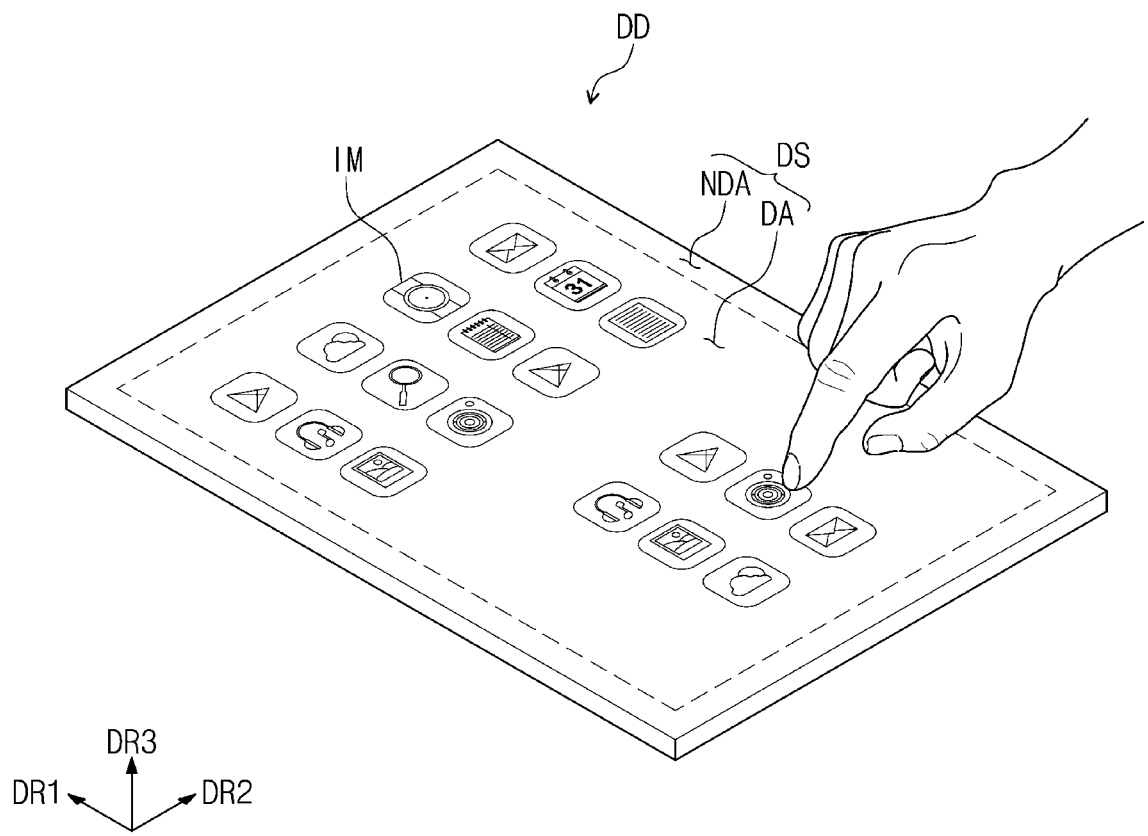
FIG. 1 is a schematic perspective view of a display device according to an embodiment.

It will be understood that when an element (or a region, a layer, a portion, or the like) is referred to as "being on," "connected to," or "coupled to" another element in the specification, it can be directly disposed on, connected or coupled to another element mentioned above, or intervening elements may be disposed therebetween.

Like numbers refer to like elements throughout. Also, in the drawings, the thicknesses, ratios, and dimensions of the elements may be exaggerated for effective description of the technical contents.

The term "and/or" includes any and all combinations of one or more of the associated listed items.

It will be understood that, although the terms first, second, and the like may be used herein to describe various elements, these elements should not be limited by these terms. These terms are only used to distinguish one element from another element. For example, a first element may be referred to as a second element, and similarly, a second element may be referred to as a first element without departing from the scope of the disclosure. The singular forms include the plural forms unless the context clearly indicates otherwise.

Also, terms such as "below," "lower," "above," and "upper" may be used to describe the relationships of the components illustrated in the drawings. These terms have a relative concept and are described on the basis of the directions indicated in the drawings.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and the disclosure, and will not be interpreted in an ideal or excessively formal sense unless clearly defined herein.

It will be understood that the term "includes" or "comprises," when used in this specification, specify the presence of stated features, integers, steps, operations, elements, components, or a combination thereof, but do not preclude the presence or addition of one or more other features, integers, steps, operations, elements, components, or combinations thereof.

Hereinafter, embodiments of the disclosure will be described in detail with reference to the accompanying drawings.

FIG. 1 is a schematic perspective view of a display device according to an embodiment.

Referring to FIG. 1, a display device DD according to an embodiment may have a rectangular shape having long sides extending in a first direction DR1 and short sides extending in a second direction DR2 intersecting the first direction DR1. However, the embodiment is not limited thereto, and the display device DD may have various shapes such as a circle or polygon.

Hereinafter, a third direction DR3 is defined as a direction that substantially perpendicularly intersects a plane defined by the first direction DR1 and the second direction DR2. Also, in the disclosure, the expression of "when viewed in a plan view" or "in a plan view" may mean viewing an object from above in the third direction DR3.

The top surface of the display device DD may be defined as a display surface DS and may have a plane or layer defined by the first direction DR1 and the second direction DR2. Through the display surface DS, an image IM generated by the display device DD may be provided to a user.

The display surface DS may include a display area DA and a non-display area NDA around or adjacent to the display area DA. The display area DA may display an image, and the non-display area NDA may not display an image. The non-display area NDA may define an edge of the display device DD, which surrounds the display area DA and is printed with a predetermined color.

The display device DD of an embodiment may be used in a large electronic apparatus such as a television, a monitor, or an outdoor advertisement board. Also, the display device DD may be used in a small-to-medium electronic apparatus such as a personal computer, a laptop computer, a personal digital terminal, a vehicle navigation system, a game console, a smartphone, a tablet computer, or a camera. However, these are merely provided as examples, and the display device DD may be used in other electronic apparatuses without departing from the disclosure.

Figure 2:
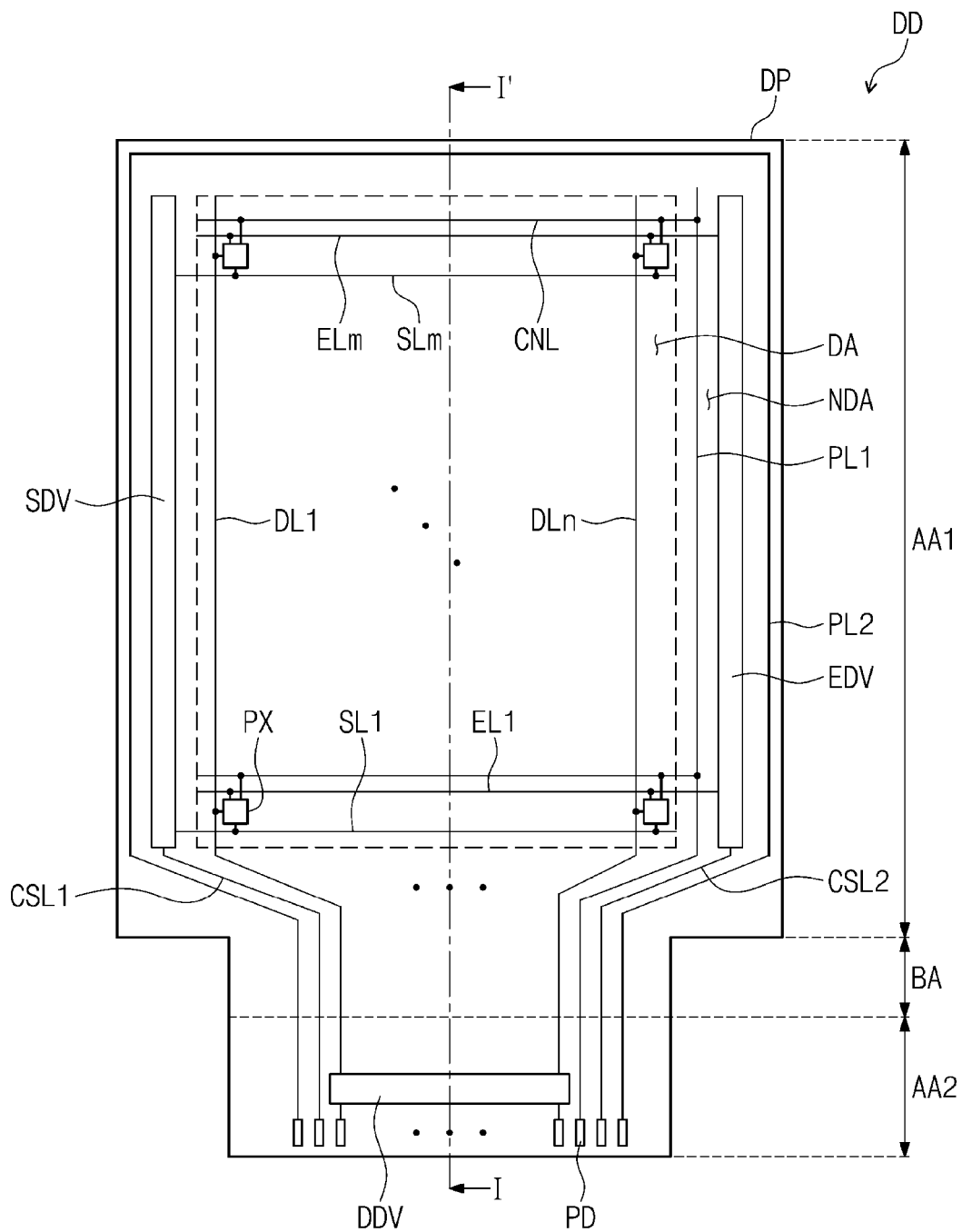
FIG. 2 is a schematic plan view of the display device illustrated in FIG. 1.

FIG. 2 is a schematic plan view of the display device illustrated in FIG. 1.

Referring to FIG. 2, the display device DD may include a display panel DP, a scan driver SDV, a data driver DDV, an emission driver EDV, a cover tape CTP, a printed circuit board PCB, and a timing controller T-CON.

The display panel DP according to the embodiment may be a light emitting-type display panel but is not limited thereto. For example, the display panel DP may be an organic light emitting display panel or a quantum-dot light emitting display panel. A light emitting layer of the organic light emitting display panel may include an organic light emitting material. A light emitting layer of the quantum-dot light emitting display panel may include quantum dots, quantum rods, or the like. Hereinafter, the display panel DP is described as the organic light emitting display panel.

The display panel DP may be a flexible display panel. For example, the display panel DP may include electronic elements disposed on a flexible substrate. The display panel DP may extend longer in the first direction DR1 than in the second direction DR2. The display panel DP may have the plane defined by first and second directions DR1 and DR2.

The display panel DP may include a first area AA1, a second area AA2, and a bending area BA disposed between the first area AA1 and the second area AA2. The first area AA1, the bending area BA, and the second area AA2 may be arranged in the first direction DR1, and the bending area BA may extend in the second direction DR2. The bending area BA may extend from the first area AA1 in the first direction DR1, and the second area AA2 may extend from the bending area BA in the first direction DR1.

The first area AA1 may have long sides which extend in the first direction DR1 and are opposite to each other in the second direction DR2. With respect to the second direction DR2, each of lengths of the bending area BA and the second area AA2 may be less than a length of the first area AA1.

The first area AA1 may include a display area DA and a non-display area NDA around or adjacent to the display area DA. The non-display area NDA may surround the display area DA. The display area DA may display an image, and the non-display area NDA may not display an image. The second area AA2 and the bending area BA may not display an image.

The display panel DP may include pixels PX, scan lines SL1 to SLm, data lines DL1 to DLn, emission lines EL1 to Elm, first and second control lines CSL1 and CSL2, a first power line PL1, a second power line PL2, connection lines CNL, and pads PD. Here, m and n are natural numbers. The pixels PX may be disposed in the display area DA and may be electrically connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed adjacent to the respective long sides of the first area AA1. The data driver DDV may be disposed on the second area AA2.

The data driver DDV may be manufactured in the form of an integrated circuit (IC) chip and mounted on the second area AA2. The data driver DDV may be defined as a driving IC. The cover tape CTP may be disposed on the second area AA2 to cover or overlap the data driver DDV.

The scan lines SL1 to SLm may extend in the second direction DR2 and be electrically connected to the scan driver SDV. The data lines DL1 to DLn may extend in the first direction DR1 and be electrically connected to the data driver DDV via the bending area BA. The emission lines EL1 to ELm may extend in the second direction DR2 and be electrically connected to the emission driver EDV.

The first power line PL1 may extend in the first direction DR1 and be disposed in the non-display area NDA. The first power line PL1 may be disposed between the display area DA and the emission driver EDV. However, the embodiments are not limited thereto, and the first power line PL1 may be disposed between the display area DA and the scan driver SDV.

The first power line PL1 may extend to the second area AA2 via the bending area BA. The first power line PL1 may extend toward a lower end of the second area AA2 in a plan view. The first power line PL1 may receive a first voltage.

The second power line PL2 may be disposed in the non-display area NDA facing the second area AA2 with the display area DA therebetween and in the non-display area NDA adjacent to the long sides of the first area AA1. The second power line PL2 may be disposed outside the scan driver SDV and the emission driver EDV.

The second power line PL2 may extend to the second area AA2 via the bending area BA. In the second area AA2, the second power line PL2 may extend in the first direction DR1 with the data driver DDV disposed therebetween. The second power line PL2 may extend toward the lower end of the second area AA2 in a plan view.

The second power line PL2 may receive a second voltage having a lower level than the first voltage. Although the connection relationship is not illustrated for the convenience of illustration, the second power line PL2 may extend to the display area DA and be electrically connected to the pixels PX, and the second voltage may be supplied to the pixels PX through the second power line PL2.

The connection lines CNL may extend in the second direction DR2 and be arranged in the first direction DR1. The connection lines CNL may be electrically connected to the first power line PL1 and the pixels PX. The first voltage may be applied to the pixels PX through the first power line PL1 and the connection lines CNL which are electrically connected to each other.

The first control line CSL1 may be electrically connected to the scan driver SDV and extend toward the lower end of the second area AA2 via the bending area BA. The second control line CSL2 may be electrically connected to the emission driver EDV and extend toward the lower end of the second area AA2 via the bending area BA. The data driver DDV may be disposed between the first control line CSL1 and the second control line CSL2.

In a plan view, the pads PD may be disposed adjacent to the lower end of the second area AA2. The data driver DDV, the first power line PL1, the second power line PL2, the first control line CSL1, and the second control line CSL2 may be electrically connected to the pads PD.

The data lines DL1 to DLn may be electrically connected to the respective pads PD through the data driver DDV. For example, the data lines DL1 to DLn may be electrically connected to the data driver DDV, and the data driver DDV may be electrically connected to the pads PD which correspond to the data lines DL1 to DLn, respectively.

The printed circuit board PCB may be electrically connected to the pads PD. The timing controller T-CON may be disposed on the printed circuit board PCB. The timing controller T-CON may be made as an integrated circuit chip and mounted on the printed circuit board PCB. The timing controller T-CON may be electrically connected to the pads PD through the printed circuit board PCB.

Although not illustrated, the display device DD may further include a voltage generator for generating the first voltage and the second voltage. The voltage generator may be electrically connected to the pads PD which are electrically connected to the first and second power lines PL1 and PL2.

The timing controller T-CON may control operations of the scan driver SDV, the data driver DDV, and the emission driver EDV. The timing controller T-CON may generate a scan control signal, a data control signal, and an emission control signal in response to control signals received from the outside.

The scan control signal may be provided to the scan driver SDV through the first control line CSL1. The emission control signal may be provided to the emission driver EDV through the second control line CSL2. The data control signal may be provided to the data driver DDV. The timing controller T-CON may receive image signals from the outside, convert the data format of image signals to satisfy interface specifications for the data driver DDV, and provide the converted image signals to the data driver DDV.

The scan driver SDV may generate scan signals in response to the scan control signal. The scan signals may be applied to the pixels PX through the scan lines SL1 to SLm. The scan signals may be sequentially applied to the pixels PX.

The data driver DDV may generate data voltages, which correspond to the image signals, in response to the data control signal. The data voltages may be applied to the pixels PX through the data lines DL1 to DLn. The emission driver EDV may generate emission signals in response to the emission control signal. The emission signals may be applied to the pixels PX through the emission lines EL1 to ELm.

The pixels PX may receive the data voltages in response to the scan signals. The pixels PX may emit light, having a luminance corresponding to the data voltages, in response to the emission signals, thereby displaying an image. Light emission times of the pixels PX may be controlled by the emission signals.

Figure 3:
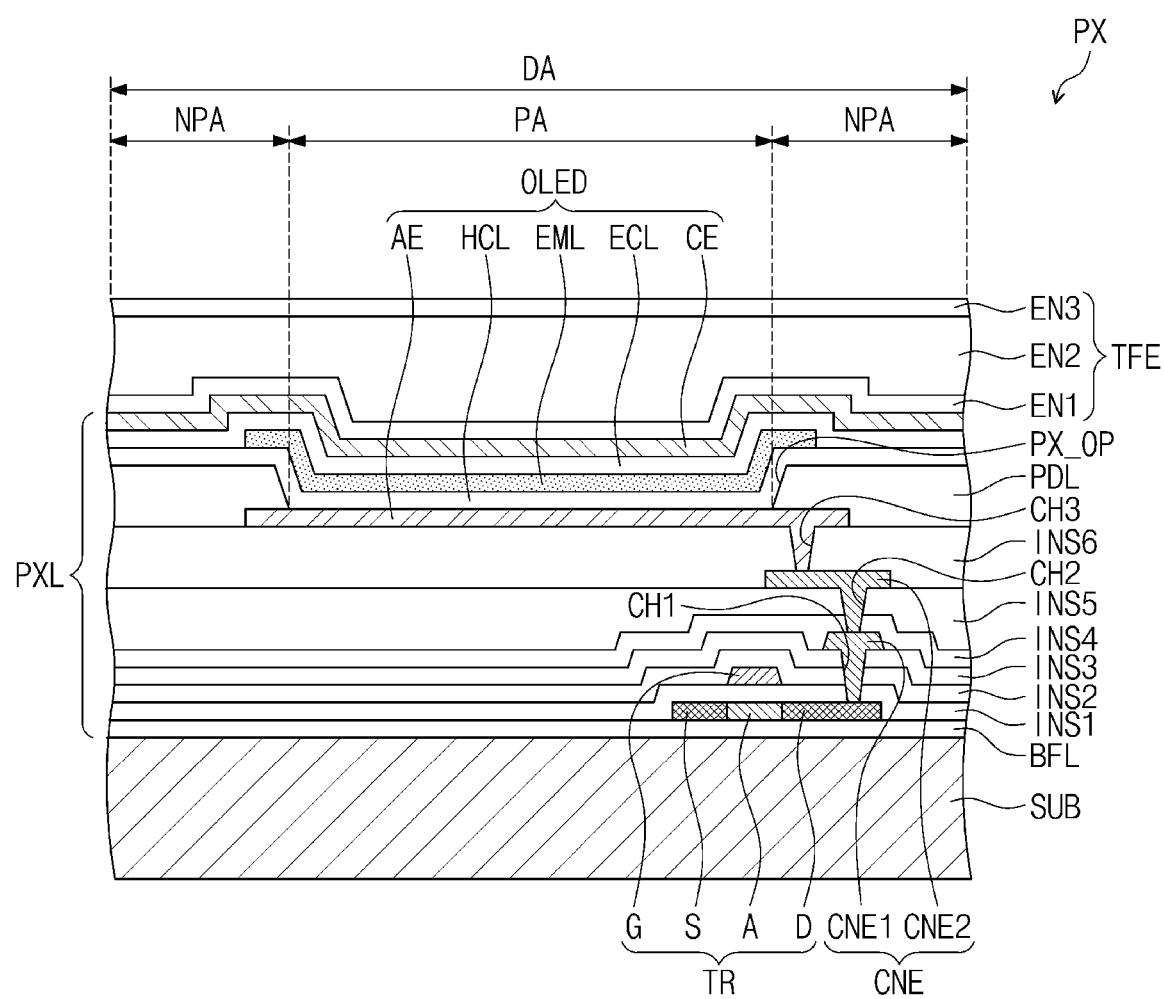
FIG. 3 is a schematic cross-sectional view illustrating one of pixels illustrated in FIG. 2.

FIG. 3 is a schematic cross-sectional view illustrating one of pixels illustrated in FIG. 2.

Referring to FIG. 3, the pixel PX may be disposed on a substrate SUB and include a transistor TR and a light emitting element OLED. The light emitting element OLED may include a first electrode AE, a sensing electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. One transistor TR is shown in the drawing, but the pixel PX may include multiple transistors and at least one capacitor to drive the light emitting element OLED.

The display area DA may include a light emitting area PA corresponding to the pixel PX and a non-light emitting area NPA adjacent to the light emitting area PA. The light emitting element OLED may be disposed in the light emitting area PA.

The substrate SUB may include a flexible plastic substrate. For example, the substrate SUB may include transparent polyimide (PI). A buffer layer BFL may be disposed on the substrate SUB, and the buffer layer BFL may be an inorganic layer. A semiconductor pattern may be disposed on the buffer layer BFL. The semiconductor pattern may include polysilicon. However, the embodiments are not limited thereto, and the semiconductor pattern may include amorphous silicon or a metal oxide.

The semiconductor pattern may be doped with an N- or P-type dopant. The semiconductor pattern may have different electrical characteristics depending on whether the semiconductor pattern is doped or not. The semiconductor pattern may include a highly-doped area and a lightly-doped area. The highly-doped area may have conductivity higher than that of the lightly-doped area and substantially function as a source electrode and a drain electrode of the transistor TR. The lightly-doped area may substantially correspond to an active layer (or channel) of the transistor TR.

A source S, an active A, and a drain D of the transistor TR may be provided from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may be disposed between the transistor TR and the light emitting element OLED and electrically connect the transistor TR to the light emitting element OLED. The connection electrode CNE may include a first connection electrode CNE1 and a second connection electrode CNE2.

The first connection electrode CNE1 may be disposed on the third insulating layer INS3 and electrically connected to the drain D through a first contact hole CH1 defined in the first to third insulating layers INS1 to INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth conductive layer INS5. The second electrode CNE2 may be electrically connected to the first connection electrode CNE1 through a second contact hole CH2 defined in the fifth insulating layer INS5. A sixth insulating layer INS6 may be disposed on the second connection electrode CNE2. Each of the first insulating layer INS1 to the sixth insulating layer INS6 may be an inorganic or organic layer.

The first electrode AE may be disposed on the sixth insulating layer INS6. The first electrode AE may be electrically connected to the second connection electrode CNE2 through a third contact hole CH3 defined in the sixth insulating layer INS6. A pixel defining layer PDL that exposes a predetermined portion of the first electrode AE may be disposed on the first electrode AE and the sixth insulating layer INS6. An opening portion PX_OP for exposing the predetermined portion of the first electrode AE may be defined in the pixel defining layer PDL.

The hole control layer HCL may be disposed on the first electrode AE and the pixel defining layer PDL. The hole control layer HCL may be disposed in common in the light emitting area PA and the non-light emitting area NPA. The hole control layer HCL may include a hole transport layer and a hole injection layer.

The light emitting layer EML may be disposed on the hole control layer HCL. The light emitting layer EML may be disposed in an area corresponding to the opening portion PX_OP. The light emitting layer EML may include an organic material and/or an inorganic material. The light emitting layer EML may generate one of red, green, or blue light.

The electron control layer ECL may be disposed on the light emitting layer EML and the hole control layer HCL. The electron control layer ECL may be disposed in common in the light emitting area PA and the non-light emitting area NPA. The electron control layer ECL may include an electron transport layer and an electron injection layer.

The second electrode CE may be disposed on the electron control layer ECL. The second electrode CE may be disposed in common in the pixels PX. A pixel layer PXL may be defined as the layers from the buffer layer BFL to the light emitting element OLED.

A thin film encapsulation layer TFE may be disposed on the light emitting element layer OLED. The thin film encapsulation layer TFE may be disposed on the second electrode CE to cover the pixels PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may be an inorganic layer, and the second encapsulation layer EN2 may be an organic layer. The first and third encapsulation layers EN1 and EN3 may protect the pixel PX from moisture or oxygen. The second encapsulation layer EN2 may protect the pixel PX from impurities such as dust particles.

The first voltage may be applied to the first electrode AE through the transistor TR, and the second voltage having a level lower than that of the first voltage may be applied to the second electrode CE. A hole and an electron injected into the light emitting layer EML may be coupled to each other to form an exciton, and when the exciton transitions to a ground state, the light emitting element OLED may emit light.

Figure 4:
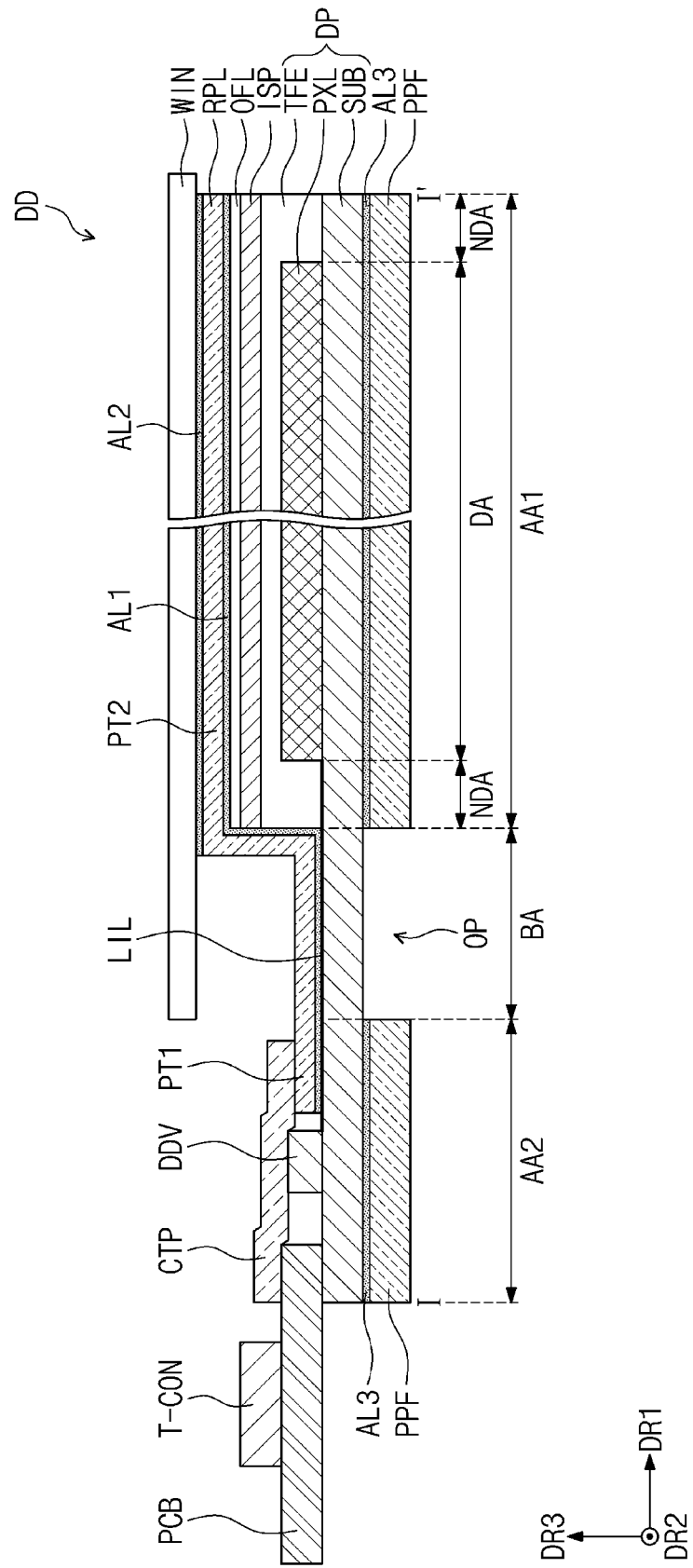
FIG. 4 is a schematic cross-sectional view taken along line I-I' of FIG. 2.
Figure 5:
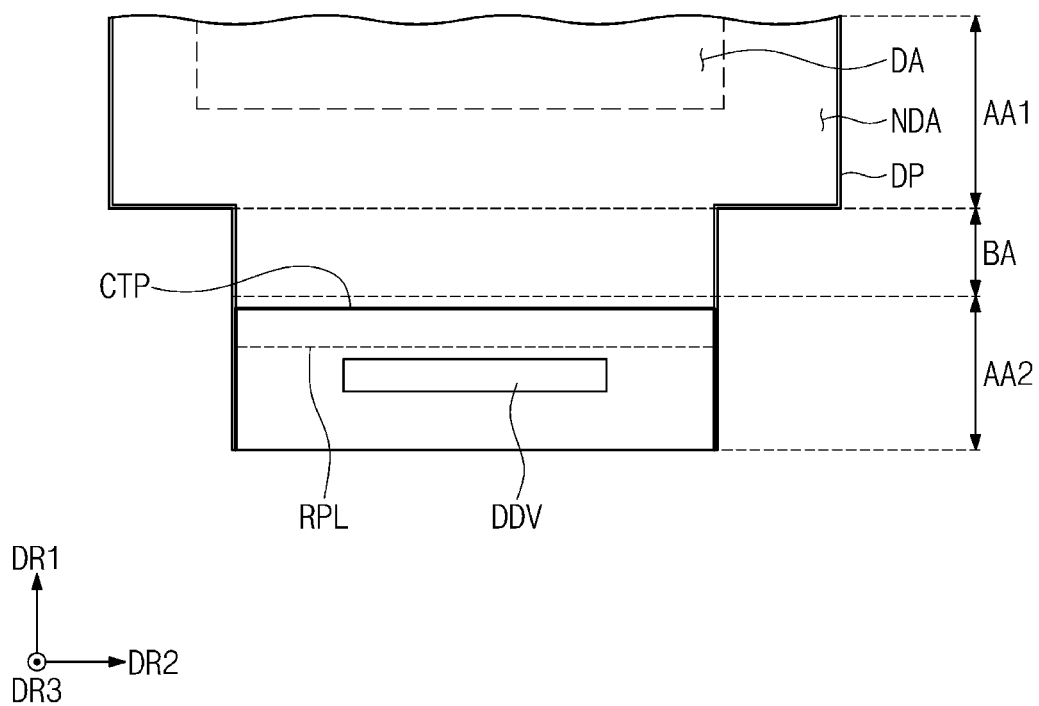
FIG. 5 is a view illustrating a plane of a second area adjacent to a bending area illustrated in FIG. 4.

FIG. 4 is a schematic cross-sectional view taken along line I-I' of FIG. 2. FIG. 5 is a view schematically illustrating a plane of the second area adjacent to the bending area illustrated in FIG. 4.

FIGS. 4 and 5, the display device DD may include the display panel DP, a panel protective film PPF, an input sensing part ISP, an optical functional layer OFL, an anti-reflection layer RPL, a window WIN, first, second, third adhesive layers AL1, AL2, and AL3, the data driver DDV, the printed circuit board PCB, the timing controller T-CON, and the cover tape CTP.

The panel protective film PPF may be disposed below the display panel DP. The panel protective film PPF may include a flexible plastic material. For example, the panel protective film PPF may include polyethylene terephthalate (PET).

In the panel protective film PPF, an opening portion OP overlapping the bending area BA may be defined. For example, the panel protective film PPF may be disposed below the first area AA1 and the second area AA2 of the display panel DP and may not be disposed below the bending area BA of the display panel DP. The panel protective film PPF may be disposed below the substrate SUB. Then, a portion of the panel protective film PPF, which overlaps the bending area BA of the display panel DP in a plan view, is substantially removed. Accordingly, the opening portion OP may be formed.

The pixel layer PXL may be disposed in the first area AA1 of the display panel DP and may overlap the display area DA in a plan view. The pixel layer PXL may be disposed on the substrate SUB in the first area AA1. The pixel layer PXL may not be disposed in the bending area BA and the second area AA2.

The thin film encapsulation layer TFE may be disposed on the pixel layer PXL in the first area AA1. The thin film encapsulation layer TFE may be disposed on the substrate SUB to cover or overlap the pixel layer PXL. The thin film encapsulation layer TFE may be disposed in the first area AA1 and may not be disposed in the bending area BA and the second area AA2.

The display panel DP may include a wiring layer LIL that extends from the pixel layer PXL. The wiring layer LIL may include the data lines DL1 to DLn of FIG. 2 that extend toward the pads PD. Also, the wiring layer LIL may include the first and second power lines PL1 and PL2 and the first and second control lines CSL1 and CSL2.

The wiring layer LIL may extend to the bending area BA and the second area AA2. For example, the wiring layer LIL may extend from the pixel layer PXL and be disposed on the substrate SUB in the bending area BA and the second area AA2.

The input sensing part ISP may be disposed on the display panel DP. The input sensing part ISP may be disposed directly on the first area AA1 of the display panel DP. For example, the input sensing part ISP may be disposed directly on the thin film encapsulation layer TFE when the display device DD is manufactured. However, the embodiments are not limited thereto. The input sensing part ISP may be made as a panel independent of the display panel DP and attached to the display panel DP by an adhesive layer. The input sensing part ISP may be disposed in the first area AA1 and may not be disposed in the bending area BA and the second area AA2.

The input sensing part ISP may sense an external input such as touch of a user, change the external input into an input signal, and provide the input signal to the display panel DP. The touch sensing part ISP may include sensor parts (not shown) for detecting the external input. The sensor parts may sense the external input in a capacitive manner. The display panel DP may receive the input signal from the input sensing part ISP and generate an image corresponding to the input signal.

The optical functional layer OFL may be disposed on the input sensing part ISP. The optical functional layer OFL may be disposed directly on the input sensing part ISP. The light received from the display panel DP may be moved further upwards by the optical functional layer OFL, and thus, the front luminance of the display device DD may be improved. The optical functional layer OFL may be omitted.

Although not shown, the optical functional layer OFL may include an organic insulating layer, which is disposed on the input sensing part ISP and includes opening portions overlapping pixel areas PA and a high refractive layer that is disposed on the input sensing part ISP to cover or overlap the organic insulating layer. The opening portions may be filled with the high refractive layer. The high refractive layer may have a refractive index higher than that of the organic insulating layer.

The organic insulating layer may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. The high refractive layer may include a siloxane-based resin. In addition to the siloxane-based resin, the high refractive layer may include at least one of zirconium oxide particles, aluminum oxide particles, or titanium oxide particles.

The light emitted from the pixel areas PA may be provided to the optical functional layer OFL. Depending on a difference in refractive indexes between the high refractive layer and the organic insulating layer, the light may be reflected from the side surface of the organic insulating layer including the opening portions. The light may be reflected from the side surface of the organic insulating layer having the opening portions, and then, may be moved further upwards.

The anti-reflection layer RPL may be disposed on the optical functional layer OFL. The anti-reflection layer RPL may reduce the reflectivity of external light which is incident toward the display panel DP from above the display device DD. For example, the anti-reflection layer RPL may include a polarization film capable of reducing the reflectivity of the external light, and the polarization film may include a phase retarder and/or a polarizer. The anti-reflection layer RPL may be defined as a polarization layer.

The window WIN may be disposed on the anti-reflection layer RPL. The window WIN may have optically transparent characteristics. The window WIN may include a transparent plastic material or glass. The window WIN may protect the display panel DP, the input sensing part ISP, and the anti-reflection layer RPL from scratches and impacts from the outside. The window WIN may be disposed above the first area AA1 and the bending area BA.

The first adhesive layer AL1 may be disposed between the anti-reflection layer RPL and the optical functional layer OFL. The anti-reflection layer RPL and the optical functional layer OFL may be bonded to each other by the first adhesive layer AL1.

The second adhesive layer AL2 may be disposed between the window WIN and the anti-reflection layer RPL. The second adhesive layer AL2 may be disposed on a second section PT2. The window WIN and the anti-reflection layer RPL may be bonded to each other by the second adhesive layer AL2. The window WIN may be attached to the second section PT2 by the second adhesive layer AL2.

The third adhesive layer AL3 may be disposed between the display panel DP and the panel protective film PPF. The third adhesive layer AL3 may be disposed below the first area AA1 and the second area AA2 and may not be disposed below the bending area BA. The display panel DP and the panel protective film PPF may be bonded to each other by the first adhesive layer AL3.

The first to third adhesive layers AL1 to AL3 may include a pressure sensitive adhesive (PSA) layer or a transparent adhesive layer such as an optically clear adhesive (OCA) layer. However, the types of adhesives are not limited thereto.

The anti-reflection layer RPL may be disposed on the first area AA1, the bending area BA, and the second area AA2. The anti-reflection layer RPL may be disposed on the first area AA1 and extend to the bending area BA and the second area AA2. The anti-reflection layer RPL may extend to a portion of the second area AA2 adjacent to the bending area BA.

The anti-reflection layer RPL may be disposed between the input sensing part ISP and the window WIN on the first area AA1 and extend to the bending area BA and the second area AA2. The anti-reflection layer RPL may be disposed on the side surface of the thin film encapsulation layer TFE and the side surface of the input sensing part ISP. With such a configuration, the anti-reflection layer RPL may be disposed on the thin film encapsulation layer TFE and extend toward the bending area BA in a stepped manner.

The anti-reflection layer RPL may be disposed on the wiring layer LIL in the bending area BA and the second area AA2 so as to protect the wiring layer LIL. The anti-reflection layer RPL may complement the rigidity of the bending area BA and prevent the bending area BA from cracking when the bending area BA is bent. The anti-reflection layer RPL may protect the bending area BA from an external impact.

In an embodiment, a separate bending protective layer may not be disposed on the bending area BA, but the anti-reflection layer RPL may extend to the bending area BA to protect the bending area BA. Thus, the separate bending protective layer may not be used.

The first adhesive layer AL1 may be disposed between the input sensing part ISP and the anti-reflection layer RPL on the first area AA1 and extend to the bending area BA and the second area AA2. The first adhesive layer AL1 may be disposed between the side surface of the anti-reflection layer RPL and the side surface of the thin film encapsulation layer TFE and between the side surface of the anti-reflection layer RPL and the side surface of the input sensing part ISP. Also, the first adhesive layer AL1 may be disposed between the anti-reflection layer RPL and the bending area BA and between the anti-reflection layer RPL and the second area AA2.

By the first adhesive layer AL1, the anti-reflection layer RPL may be attached to the side surface of the thin film encapsulation layer TFE, the side surface of the input sensing part ISP, and the side surface of the optical functional layer OFL. Also, the anti-reflection layer RPL may be attached to the bending area BA and the second area AA2 by the first adhesive layer AL1.

The data driver DDV may be disposed on the second area AA2. The data driver DDV may be mounted on the second area AA2. The wiring layer LIL may extend to the substrate SUB of the second area AA2 and be electrically connected to the data driver DDV. The anti-reflection layer RPL may be spaced apart from the data driver DDV. However, the embodiments are not limited thereto, and the anti-reflection layer RPL may be closer to the data driver DDV and contact the side surface of the data driver DDV.

The timing controller T-CON may be disposed on the printed circuit board PCB. A portion of the printed circuit board PCB, which does not overlap the timing controller T-CON, may be spaced apart from the data driver DDV and be disposed on the second area AA2. The printed circuit board PCB may be connected to the second area AA2. The timing controller T-CON may be spaced apart from the second area AA2. The data driver DDV may be disposed between the printed circuit board PCB and the anti-reflection layer RPL on the second area AA2 of the display panel DP.

Hereinafter, a portion of the anti-reflection layer RPL, which overlaps the second area AA2 in a plan view, may be defined as a first section PT1, and another portion of the anti-reflection layer RPL, which overlaps the first area AA1 in the plan view, may be defined as a second section PT2. The window WIN may be disposed on the second section PT2 and extend toward the bending area BA.

The cover tape CTP may be disposed on the second area AA2. The cover tape CTP may be disposed on the data driver DDV. The cover tape CTP may be spaced apart from the timing controller T-CON and disposed on a portion of the printed circuit board PCB disposed on the second area AA2. The cover tape CTP may be disposed in the first section PT1 of the anti-reflection layer RPL disposed on the second area AA2. The cover tape CTP may not be disposed in the bending area BA.

An edge of the cover tape CTP disposed on the printed circuit board PCB is illustrated as overlapping an edge of the second area AA2 in a plan view, but the embodiments are not limited thereto. For example, the cover tape CTP may further extend to the printed circuit board PCB and be disposed closer to the timing controller T-CON.

An edge of the cover tape CTP adjacent to the bending area BA may be spaced apart from a boundary between the bending area BA and the second area AA2. However, the embodiments are not limited thereto, and the edge of the cover tape CTP may overlap the boundary between the bending area BA and the second area AA2. The cover tape CTP may include an insulating tape including an organic material.

FIG. 6 is a schematic view illustrating a structure of the anti-reflection layer illustrated in FIG. 5.

As an example, FIG. 6 shows a portion of the anti-reflection layer.

Referring to FIG. 6, the anti-reflection layer RPL may include a polarization film PFM for reducing the reflectivity of external light and a hard coating layer HC disposed on the polarization film PFM. The polarization film PFM may include a phase retarder and/or a polarizer for reducing the reflectivity of the external light. The hard coating layer HC may protect the polarization film PFM from scratches and impacts from the outside.

FIG. 7 is a view schematically illustrating a structure of a cover tape illustrated in FIG. 5.

As an example, the cover tape CTP of FIG. 7 is shown as being flat.

Referring to FIG. 7, the cover tape CTP may include a conductive layer CTL, a first insulating tape ITP1 disposed below the conductive layer CTL, and a second insulating tape ITP2 disposed on the conductive layer CTL. The conductive layer CTL may include a conductive material. The conductive layer CTL may be defined as an antistatic layer.

Although not shown, the first insulating tape ITP1 may include a base layer, which includes an insulating material and has flexibility, and an adhesive disposed on each of the top and bottom surfaces of the base layer. The first insulating tape ITP1 may be disposed on the data driver DDV. The data driver DDV and the conductive layer CTL may be attached to the adhesives of the first insulating tape ITP1.

Although not shown, the second insulating tape ITP2 may include a base layer, which includes an insulating material and has flexibility, and an adhesive disposed on a bottom surface of the base layer. The conductive layer CTL may be attached to the adhesive of the second insulating tape ITP2. An adhesive may not be disposed on a top surface of the base layer. The second insulating tape ITP2 may not be disposed on a portion of the conductive layer CTL, for example, on a portion adjacent to a side of the conductive layer CTL. Thus, the portion of the conductive layer CTL may be exposed to the outside.

Although not shown, the conductive layer CTL may be connected to a ground layer disposed inside the printed circuit board PCB. External static electricity may be applied to the portion of the conductive layer CTL which is exposed to the outside. The static electricity may be discharged through the conductive layer CTL and the ground layer. Thus, elements in the display device DD may be prevented from being damaged by the external static electricity.

Figure 8:
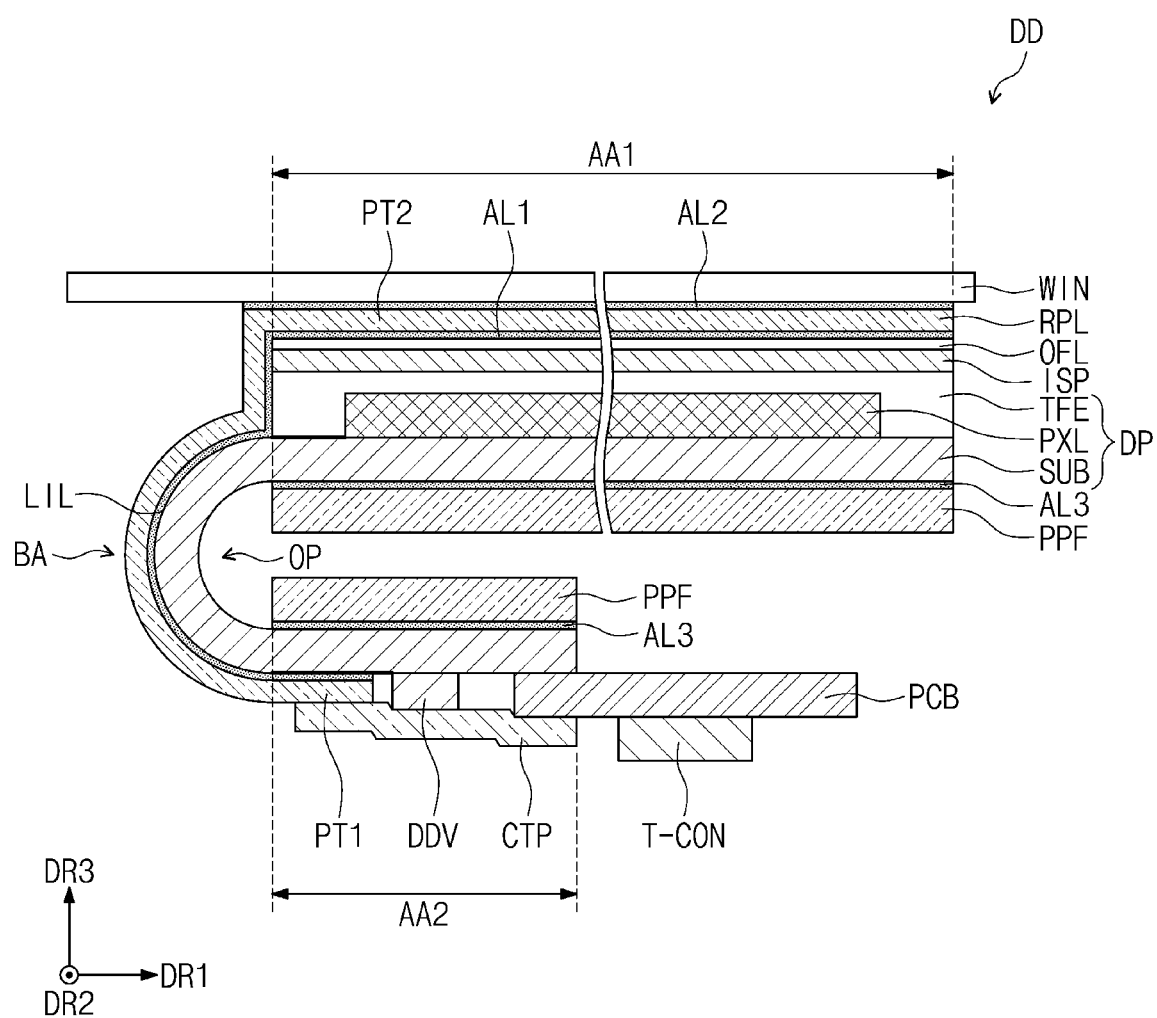
FIG. 8 is a view schematically illustrating a bending state of a bending area illustrated in FIG. 4.

FIG. 8 is a view schematically illustrating a bending state of the bending area illustrated in FIG. 4.

Referring to FIGS. 4 and 8, the bending area BA may be bent such that the second area AA2 is disposed below the first area AA1. Thus, the data driver DDV may be disposed below the first area AA1.

The bending area BA may be bent to protrude toward the outside of the display panel DP. The bending area BA may be bent to have a predetermined curvature. The data driver DDV may be disposed below the second area AA2 in FIG. 8.

If the panel protective film PPF is disposed below the bending area BA, the thickness of an area of the display device DD, in which the bending area BA is disposed, is increased. Thus, it may be difficult to bend the bending area BA. However, in an embodiment, the panel protective film PPF may not be disposed below the bending area BA, and the opening portion OP may be defined. Thus, the bending area BA may be easily bent.

The second area AA2 and the bending area BA, which do not display an image, may be defined as a bezel area. The second area AA2 may be disposed below the bottom surface of the first area AA1, and thus, the bezel area of the display panel DP may be minimized or reduced in a plan view.

In case that a separate bending protective layer is disposed on the bending area BA, the bending protective layer made of an acryl-based resin or a urethane-based resin may have a thickness greater than that of the anti-reflection layer RPL. However, in an embodiment, the anti-reflection layer RPL having a thickness less than that of the bending protective layer may be disposed on the bending area BA so as to protect the bending area BA. Thus, the thickness of the area of the display device DD, in which the bending area BA is disposed, may be reduced.

FIGS. 9 to 20 are views schematically illustrating a method for manufacturing a display device according to an embodiment.

As an example, FIGS. 9 to 13 and FIGS. 16 to 20 show schematic cross-sections corresponding to FIG. 4. Also, FIG. 14 shows a schematic plan view corresponding to FIG. 5.

Figure 9:
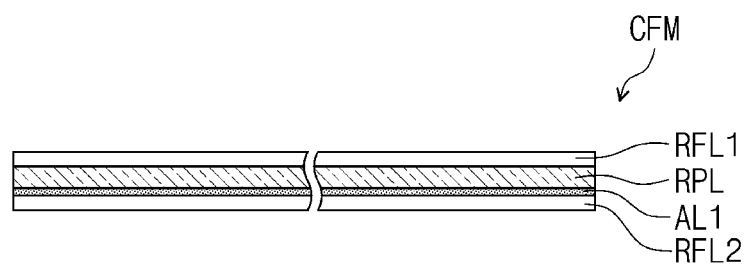
FIGS. 9 to 20 are views schematically illustrating a method for manufacturing a display device according to an embodiment.

Referring to FIG. 9, a carrier film CFM may be prepared. The carrier film CFM may include an anti-reflection layer RPL, a first adhesive layer AL1, a first releasing film RFL1, and a second releasing film RFL2. The first releasing film RFL1 may be disposed on the anti-reflection layer RPL. The first adhesive layer AL1 may be disposed below the anti-reflection layer RPL, and the second releasing film RFL2 may be disposed below the first adhesive layer AL1.

The anti-reflection layer RPL may be disposed between the first releasing film RFL1 and the second releasing film RFL2. The anti-reflection layer RPL may be conveyed while being protected by the first releasing film RFL1 and the second releasing film RFL2. The first releasing film RFL1 and the second releasing film RFL2 may be easily peeled off or removed from the anti-reflection layer RPL. The first releasing film RFL1 and the second releasing film RFL2 may include a plastic material such as polyethylene terephthalate (PET).

Figure 10:
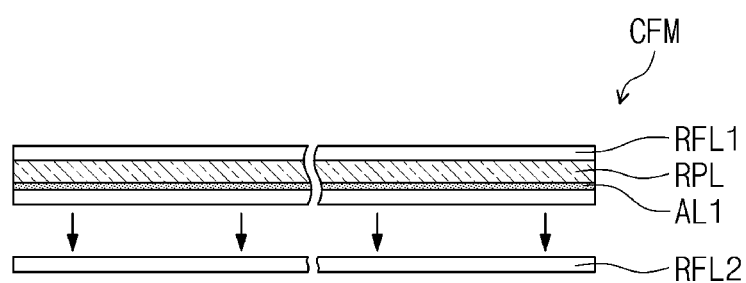

Referring to FIG. 10, the second releasing film RFL2 may be removed from the anti-reflection layer RPL. The second releasing film RFL2 attached to the first adhesive layer AL1 may be peeled off. Thus, the first adhesive layer AL1 may be exposed to the outside.

Figure 11:
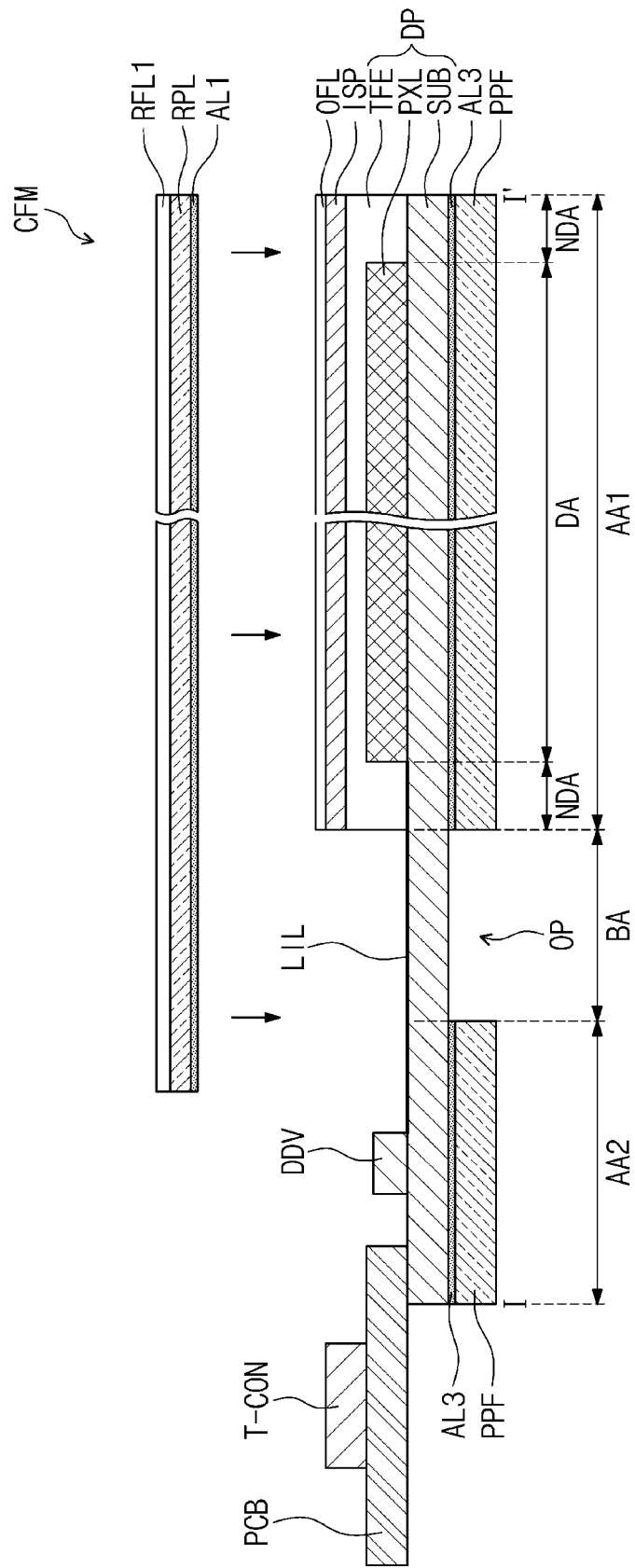

Referring to FIG. 11, a display panel DP may be prepared. An input sensing part ISP may be provided on a first area AA1 of the display panel DP, and an optical functional layer OFL may be provided on the input sensing part ISP. A data driver DDV may be provided on a second area AA2 of the display panel DP.

A portion of printed circuit board PCB, on which a timing controller T-CON is mounted, may be spaced apart from the data driver DDV and be provided on the second area AA2. The carrier film CFM, from which the second releasing film RFL2 is removed, may be provided on the display panel DP.

Figure 12:
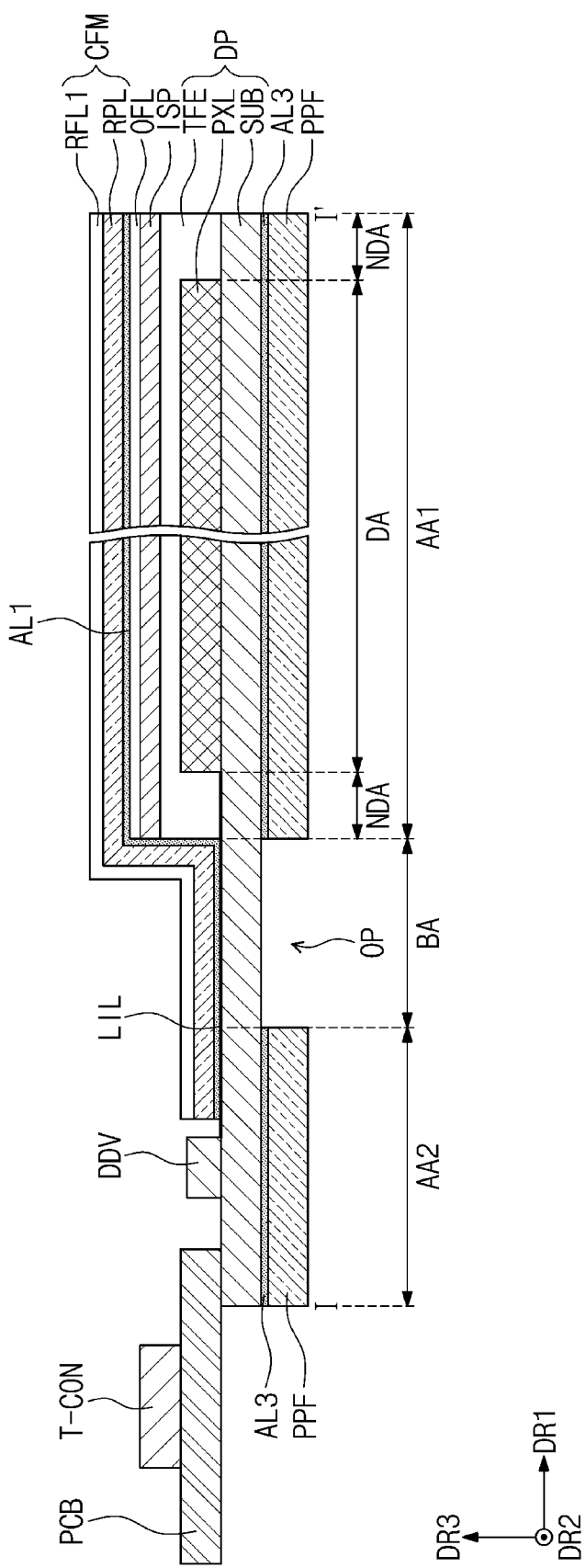

Referring to FIGS. 11 and 12, the anti-reflection layer RPL may be attached to the display panel DP. For example, the anti-reflection layer RPL may be attached to the display panel DP by the first adhesive layer AL1. The anti-reflection layer RPL may be disposed on the first area AA1 and a bending area BA.

The anti-reflection layer RPL may be spaced apart from the data driver DDV and disposed on the second area AA2 adjacent to the bending area BA. Thus, the data driver DDV may be provided between the anti-reflection layer RPL and the printed circuit board PCB.

Figure 13:
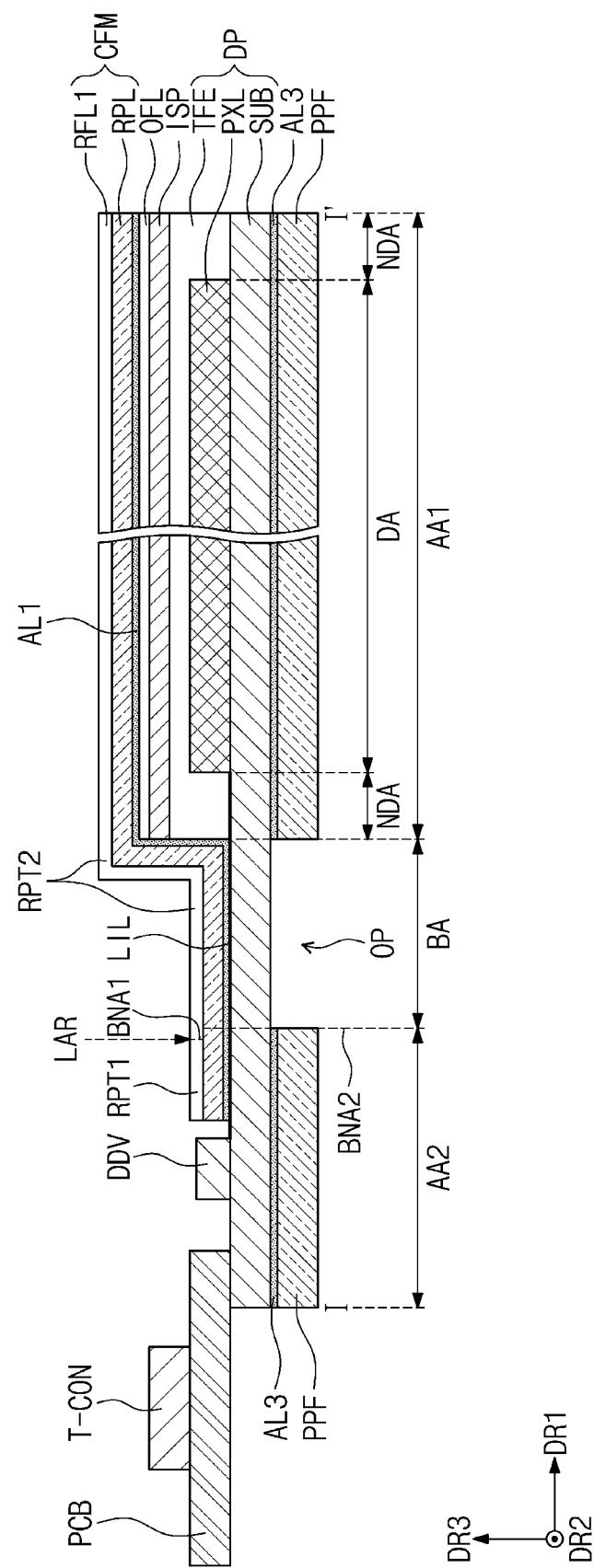
Figure 14:
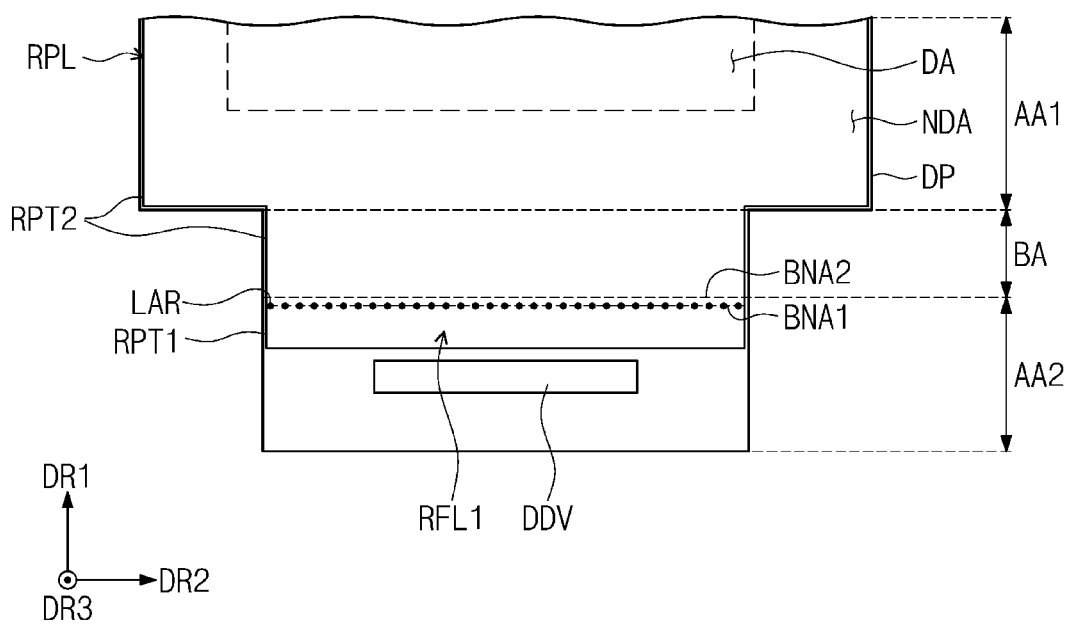

Referring to FIG. 13, the first releasing film RFL1 may include a first removal section RPT1 overlapping the second area AA2 in a plan view and a second removal section PRT2 overlapping the bending area BA and the first area AA1 in the plan view. A first boundary BNA1 between the first removal section RPT1 and the second removal section RPT2 may be spaced apart from a second boundary BNA2 between the bending area BA and the second area AA2 and overlap the second area AA2 in the plan view.

The first boundary BNA1 between the first removal section RPT1 and the second removal section RPT2 may be cut by irradiating, with a laser beam LAR, the first boundary BNA1 between the first removal section RPT1 and the second removal section RPT2. The laser beam LAR may be (or include) a $CO_2$ laser beam, a UV laser beam, or a femtosecond laser beam.

Referring to FIGS. 13 and 14, the first releasing film RFL1 may be irradiated with the laser beam LAR in a second direction DR2. The first boundary BNA1 may be irradiated with the laser beam LAR multiple times.

Figure 15:
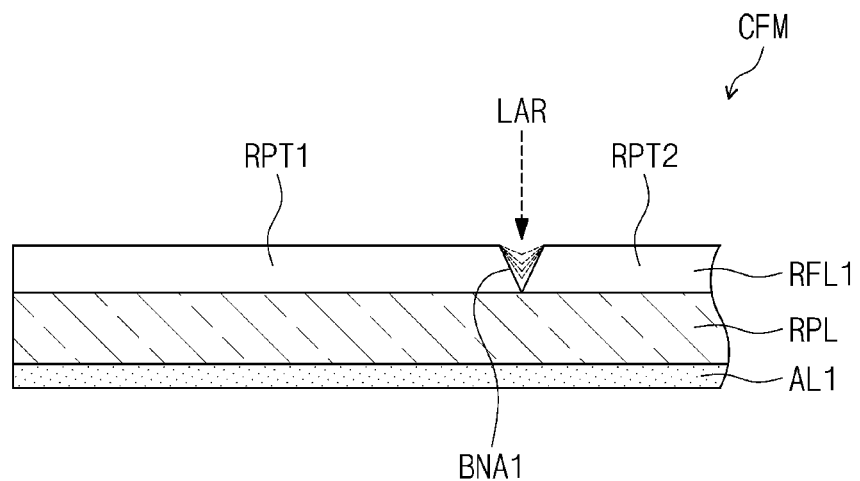

FIG. 15 is a schematic enlarged view illustrating an anti-reflection layer and a first releasing film of FIG. 13.

Referring to FIGS. 14 and 15, as the first boundary BNA1 is irradiated with the laser beam LAR multiple times, the first boundary BNA1 may be removed from top to bottom. Thus, the first boundary BNA1 may be cut. The anti-reflection layer RPL may not be irradiated with the laser beam LAR.

In case that the carrier film CFM is irradiated with a laser beam LAR having a higher energy, even the anti-reflection layer RPL may be irradiated with the laser beam LAR. Thus, the anti-reflection layer RPL may be damaged. A moving speed of the laser beam LAR may affect the depth of a portion to be cut. In case that the laser beam LAR moves slowly, a larger amount of energy may be applied to the portion to be cut, and thus, even the anti-reflection layer RPL may be irradiated with the laser beam LAR.

In order for the anti-reflection layer RPL not to be irradiated with the laser beam LAR, the energy of the laser beam LAR, the moving speed of the laser beam LAR, and the irradiation times of the laser beam LAR may be determined based on the thickness of the first releasing film RFL1.

In case that the first releasing film RFL1 has a thickness of about 40 µm to about 60 µm, the laser beam LAR may have an energy of about 5 W to about 10 W, move at a speed of about 300 mm/s, and be emitted onto the first boundary BNA1 about 5 to about 6 times. In this case, the first releasing film RFL1 may be irradiated with the laser beam LAR, but the anti-reflection layer RPL may not be irradiated with the laser beam LAR.

Figure 16:
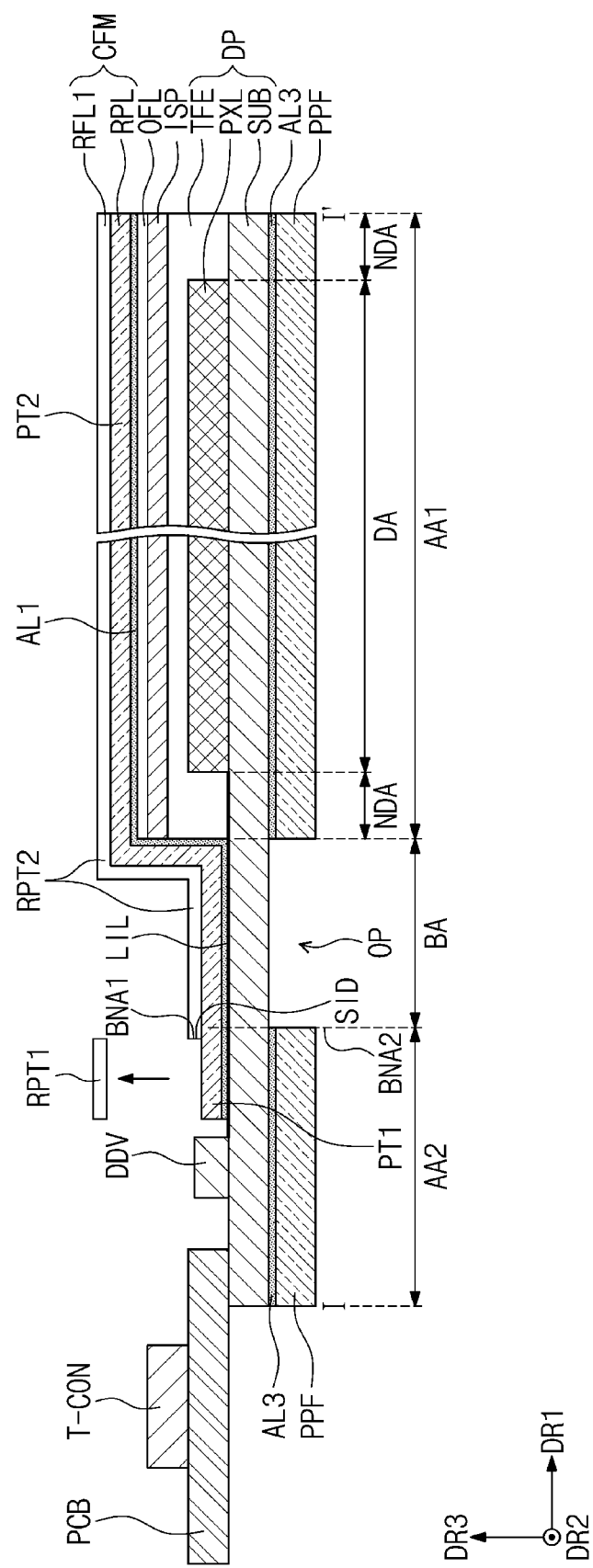

Referring to FIG. 16, after the first boundary BNA1 is cut by the laser beam LAR, the first removal section RPT1 may be removed. After the first removal section RPT1 is removed, a side surface SID of the second removal section RPT2 may be defined by the first boundary BNA1 of the first releasing film RFL1.

Figure 17:
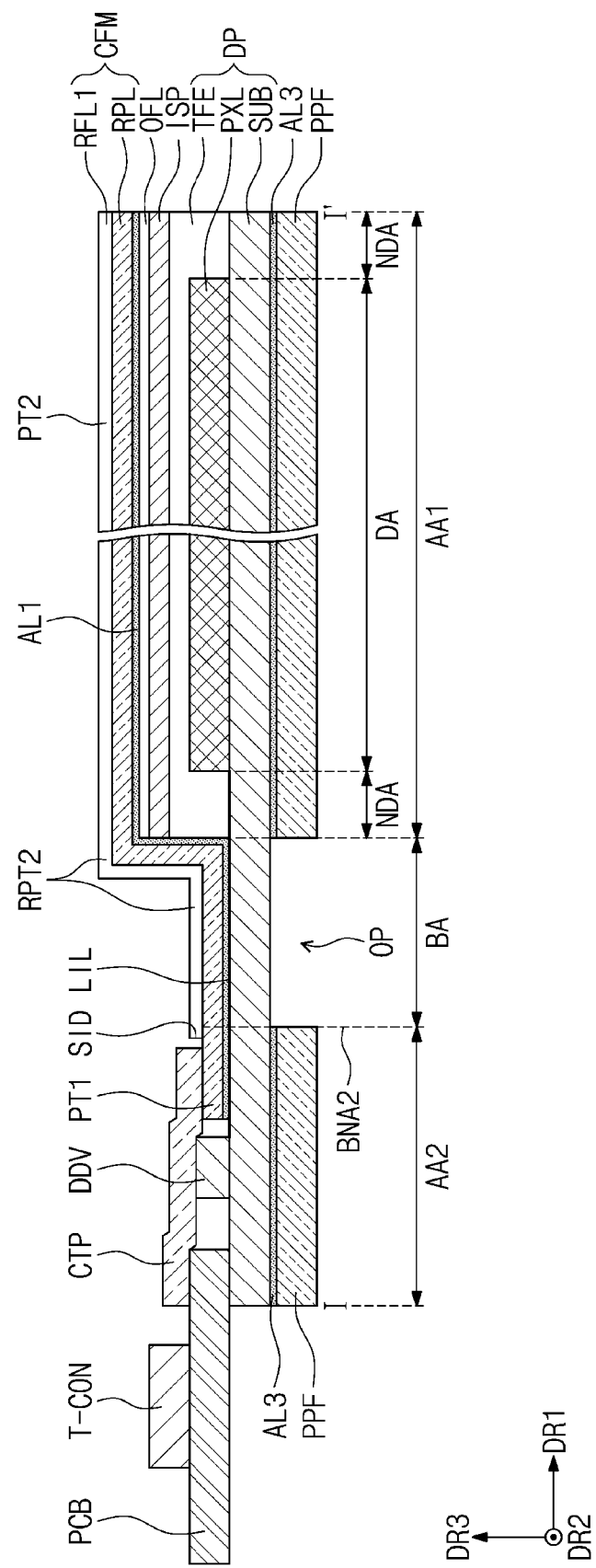

Referring to FIG. 17, a cover tape CTP may be provided on the data driver DDV, a first section PT1 of the anti-reflection layer RPL, and a portion of the printed circuit board PCB disposed on the second area AA2.

In a plan view, an edge of the cover tape CTP adjacent to the bending area BA may be spaced apart from the second boundary BNA2. In a plan view, the edge of the cover tape CTP adjacent to the bending area BA may be spaced apart from the side surface SID of the second removal section RPT2.

In a plan view, the side surface SID of the second removal section RPT2 may be disposed between the edge of the cover tape CTP and the second boundary BNA2. For example, the side surface SID of the second removal section RPT2 may be spaced apart from the edge of the cover tape CTP.

During a process for attaching the cover tape CTP, it may be difficult for the edge of the cover tape CTP to exactly contact the first boundary BNA1. Thus, taking process margin into consideration, the edge of the cover tape CTP may be spaced apart from the side surface SID of the second removal section RPT2.

After the cover tape CTP is attached, the display panel DP may be conveyed to a process chamber for attaching a window WIN. During the process for attaching the cover tape CTP, not only the first removal section RPT1 but also the second removal section RPT2 may be removed. In this case, while being conveyed to the process chamber for attaching the window WIN, foreign substances may be stuck on the top surface of the anti-reflection layer RPL disposed on the bending area BA and the first area AA1. A defective display device DD may be manufactured by the foreign substances.

In an embodiment, while the display panel DP is conveyed for another process after the cover tape CTP is attached, the second removal section RPT2 disposed on the first area AA1 and the bending area BA may not be removed. The anti-reflection layer RPL disposed on the first area AA1 and the bending area BA may be protected by the second removal section RPT2 of the first releasing film RFL1. Thus, while the display panel DP is conveyed for another process, foreign substances may not be stuck on the top surface of the anti-reflection layer RPL disposed on the first area AA1 and the bending area BA.

Figure 18:
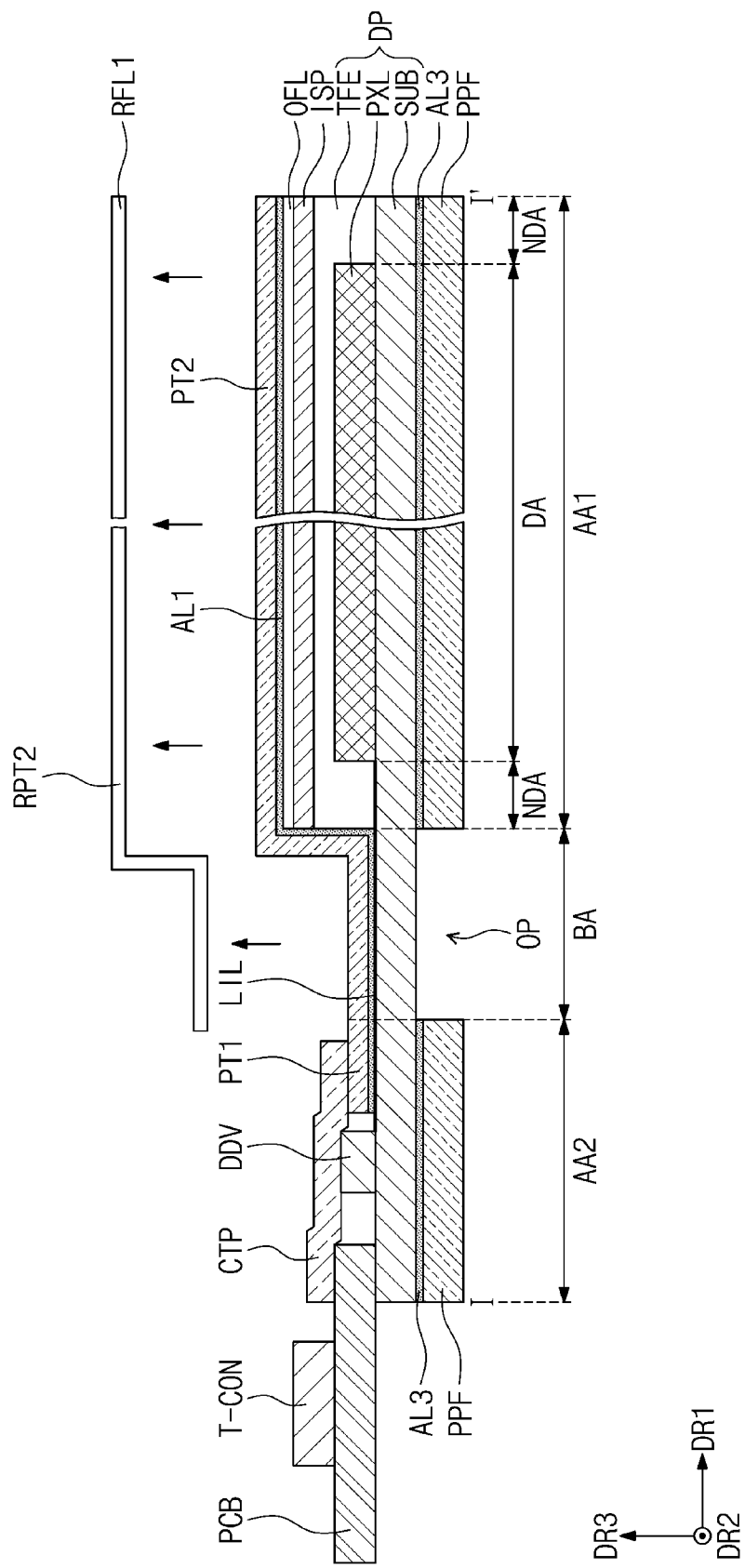

Referring to FIG. 18, after the display panel DP is conveyed to the process chamber for attaching the window WIN, the second removal section RPT2 may be removed.

Figure 19:
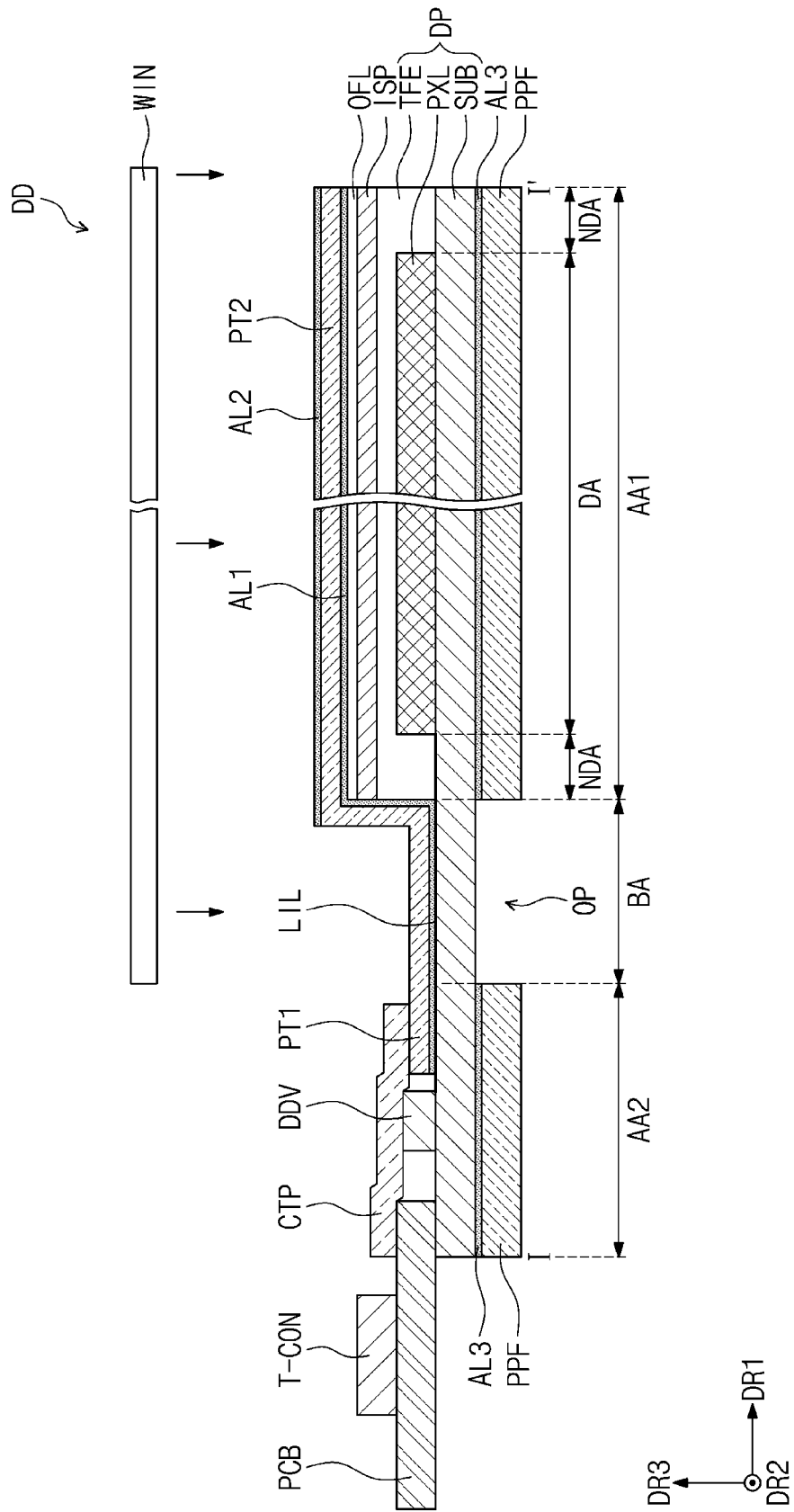

Referring to FIG. 19, a second adhesive layer AL2 may be provided on the second section PT2 of the anti-reflection layer RPL. The window WIN may be provided on the first area AA1 and the bending area BA, and the window WIN may be disposed on the anti-reflection layer RPL. The second adhesive layer AL2 may be disposed between the second section PT2 and the window WIN, and the window WIN may be attached to the second section PT2 by the second adhesive layer AL2.

Figure 20:
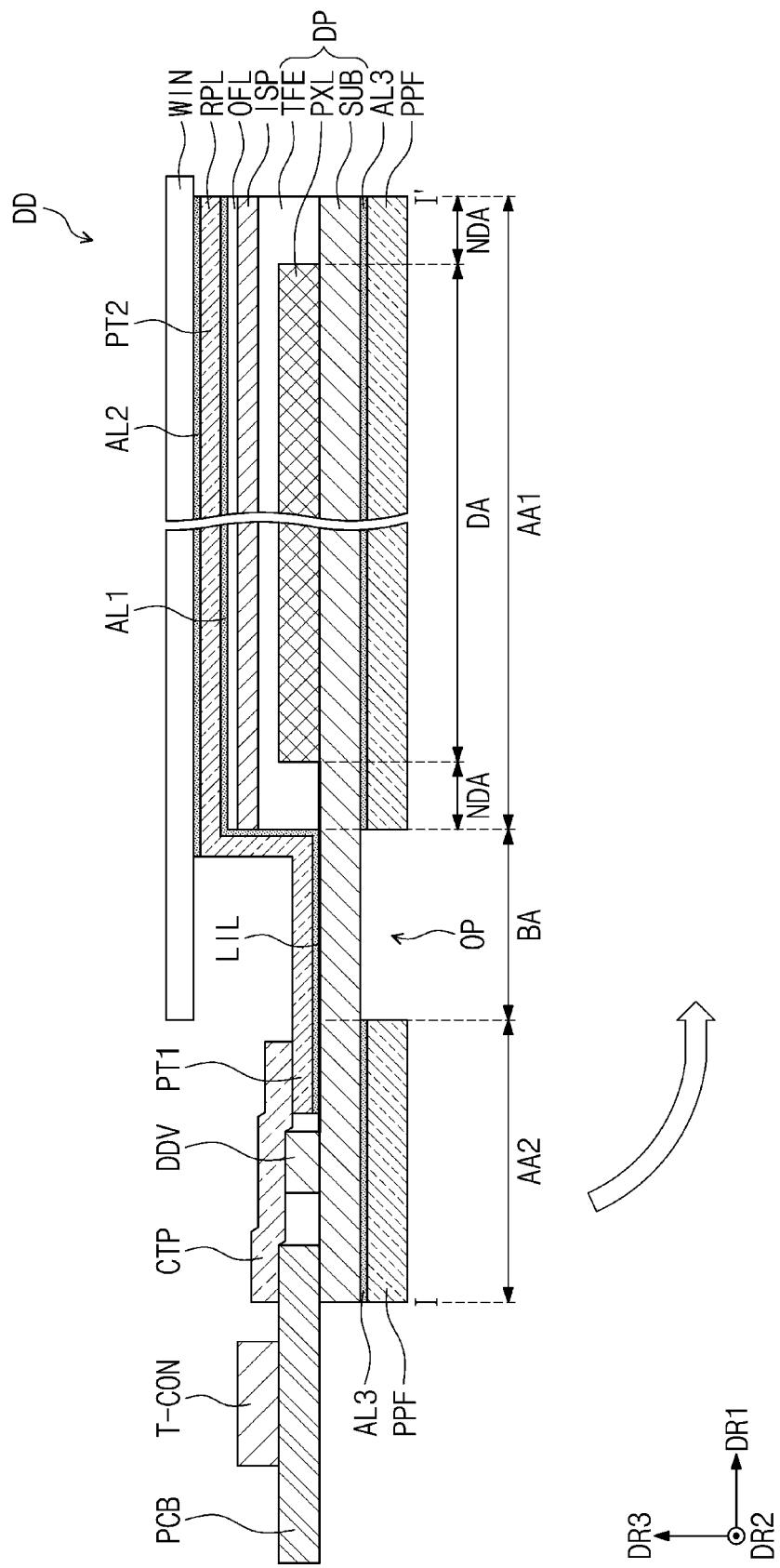

Referring to FIG. 20, the bending area BA may be bent, and the second area AA2 is disposed below the first area AA1. Thus, as illustrated in FIG. 8, the bending area BA may be bent to have a predetermined curvature, and finally, the display device DD may be manufactured.

In an embodiment, the first removal section RPT1 may be removed, and the cover tape CTP may be attached to the first section PT1. Subsequently, the second removal section RPT2 may be removed, and the window WIN may be attached to the second section PT2. Thus, the cover tape CTP and the window WIN may be attached to the anti-reflection layer RPL while the anti-reflection layer RPL is protected.

Figure 21:
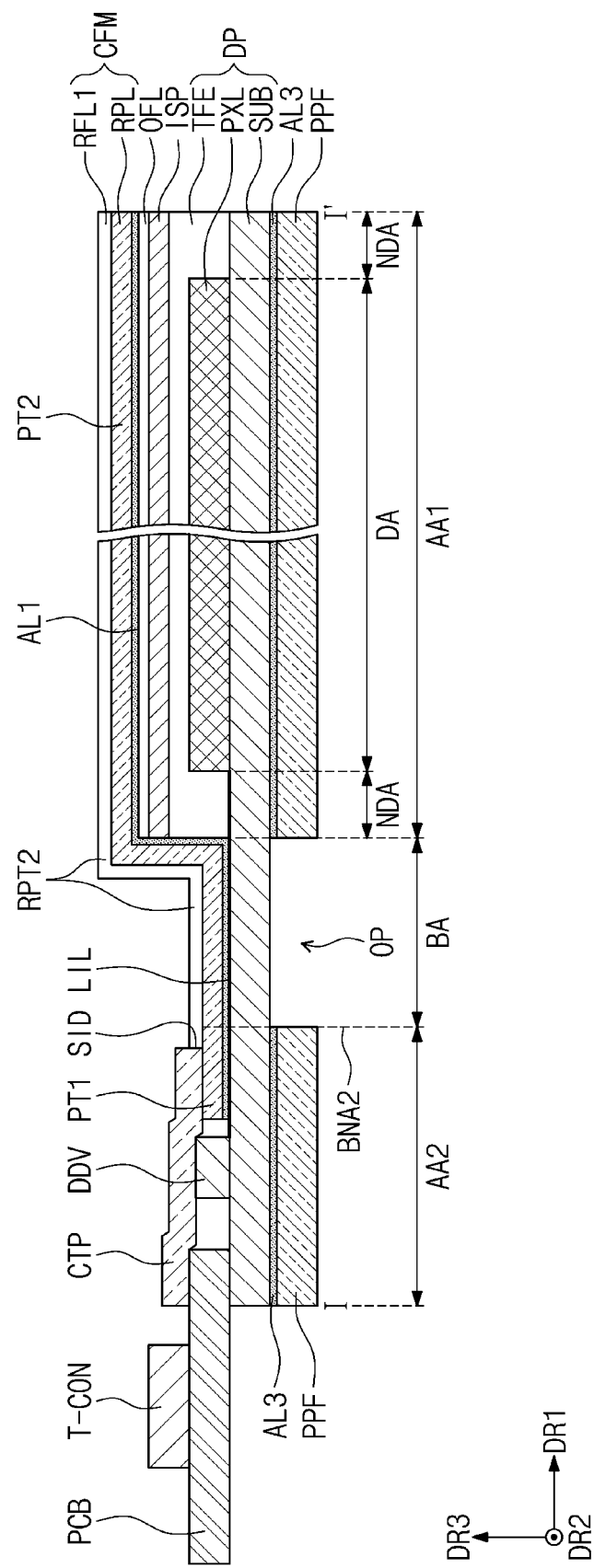
FIGS. 21 to 23 are views schematically illustrating a method for manufacturing a display device according to another embodiment.
Figure 22:
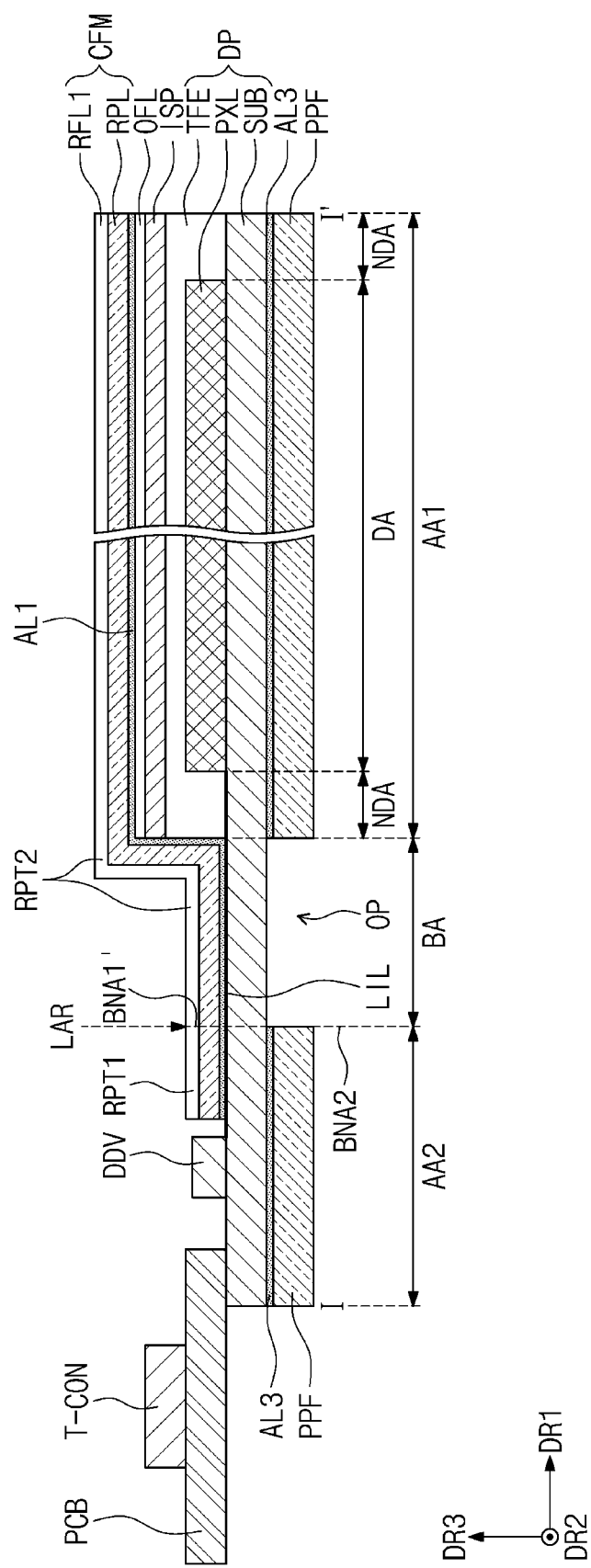
Figure 23:
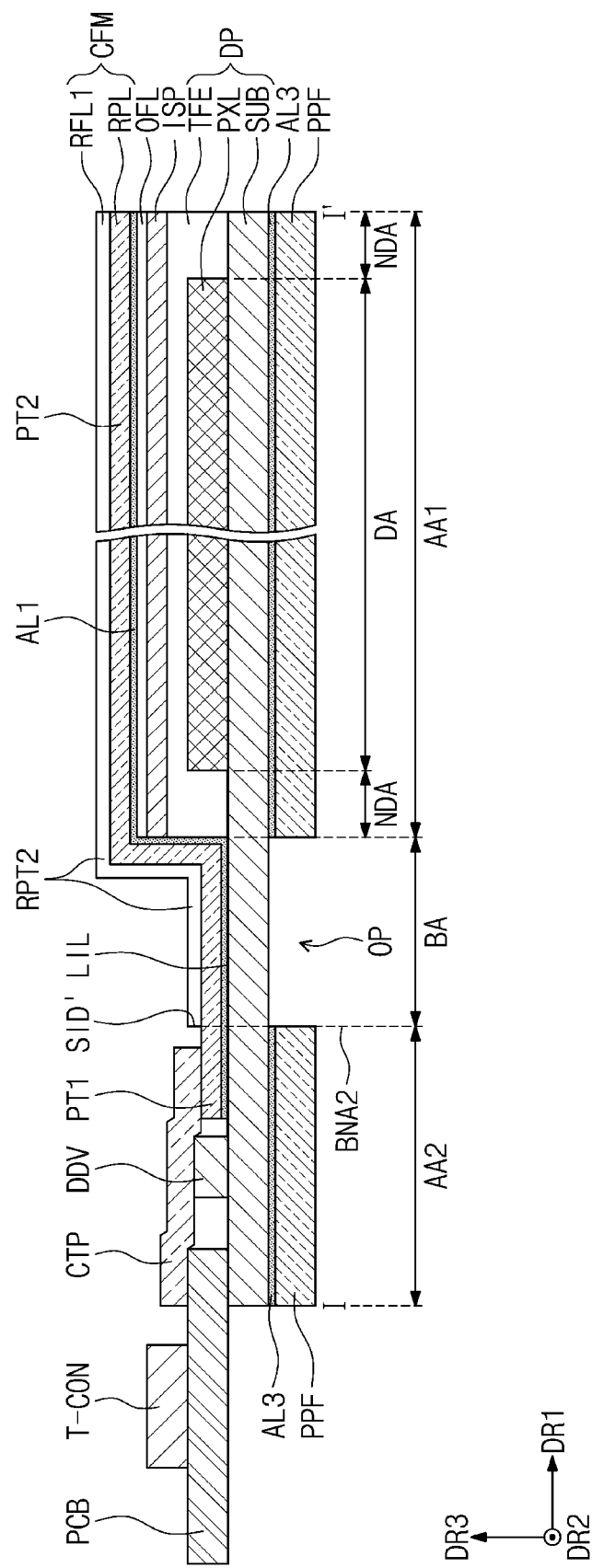

FIGS. 21 to 23 are views schematically illustrating a method for manufacturing a display device according to another embodiment.

As an example, except that the arrangements of the cover tape CTP and the portion to be cut by the laser beam LAR are different, a method for manufacturing a display device according to another embodiment may be the same as the method for manufacturing the display device DD illustrated in FIGS. 9 to 20.

Referring to FIG. 21, after a first removal section RPT1 is removed, a cover tape CTP may be disposed on a first section PT1. Unlike the structure illustrated in FIG. 17, the cover tape CTP may contact a side surface SID of a second removal section RPT2. Thus, the anti-reflection layer RPL may not be exposed to the outside by the cover tape CTP and the second removal section RPT2.

Referring to FIG. 22, unlike the structure illustrated in FIG. 13, a first boundary BNA1' may overlap a second boundary BNA2. The first boundary BNA1' may be cut by a laser beam LAR.

Referring to FIG. 23, after a first removal section RPT1 is removed, a cover tape CTP may be disposed on a first section PT1. A side surface SID' of a second removal section RPT2 may overlap a second boundary BNA2.

An edge of the cover tape CTP adjacent to a bending area BA may be spaced apart from the side surface SID' of the second removal section RPT2. However, the embodiments are not limited thereto. Similar to the structure illustrated in FIG. 21, the edge of the cover tape CTP may contact the side surface SID' of the second removal section RPT2.

According to an embodiment, a section of the first releasing film, which is disposed on a region of the anti-reflection layer to which the cover tape is to be attached, may be removed, and subsequently, the other portion of the first releasing film, which is disposed on a region of the anti-reflection layer to which the window is to be attached, may be removed. Therefore, the cover tape and the window may be easily attached to the anti-reflection layer while the anti-reflection layer is protected.

Although some embodiments of the disclosure have been described, it is understood that various changes and modifications can be made by one ordinary skilled in the art within the spirit and scope of the disclosure as hereinafter claimed. Also, the embodiments disclosed in the disclosure are not intended to limit the technical ideas of the disclosure, and all technical ideas within the following claims and their equivalents should be interpreted to be included in the scope of right in the disclosure.

What is claimed is:

1. A method for manufacturing a display device, the method comprising:
    preparing a display panel that comprises:
        a first area;
        a bending area extending from the first area; and
        a second area extending from the bending area;
    attaching an anti-reflection layer to the display panel;
    removing a first removal section of a first releasing film disposed on the anti-reflection layer, the first removal section overlapping the second area of the display panel in a plan view;
    providing a cover tape onto a first section of the anti-reflection layer that overlaps the second area of the display panel in a plan view; and
    removing a second removal section of the first releasing film that overlaps both the first area and the bending area of the display panel in a plan view.

2. The method of claim 1, further comprising:
    providing a window onto a second section of the anti-reflection layer that overlaps the first area of the display panel in a plan view.

3. The method of claim 2, further comprising cutting a first boundary between the first removal section and the second removal section of the first releasing film by irradiating a laser beam to the first boundary.

4. The method of claim 3, wherein the cutting of the first boundary comprises irradiating the laser beam multiple times onto the first boundary.

5. The method of claim 3, wherein the cutting of the first boundary comprises not irradiating the laser beam onto the anti-reflection layer.

6. The method of claim 3, wherein
    the first releasing film has a thickness in a range of about 40 μm to about 60 μm,
    the laser beam has an energy in a range of about 5 W to about 10 W and is irradiated onto the first boundary at a speed of about 300 mm/sec about 5 times to about 6 times, and
    the laser beam comprises a $CO_2$ laser beam, a UV laser beam, or a femtosecond laser beam.

7. The method of claim 3, wherein, in a plan view, the first boundary is spaced apart from a second boundary between the bending area and the second area of the display panel and overlaps the second area of the display panel.

8. The method of claim 7, wherein
    in a plan view, an edge of the cover tape adjacent to the bending area of the display panel is spaced apart from both a side surface of the second removal section of the first releasing film and the second boundary, the side surface of the second removal section being defined by the first boundary after the first removal section of the first releasing film is removed, and in a plan view, the side surface of the second removal section of the first releasing film is disposed between the edge of the cover tape and the second boundary.

9. The method of claim 7, wherein, in a plan view, an edge of the cover tape adjacent to the bending area of the display panel is spaced apart from the second boundary and contacts a side surface of the second removal section of the first releasing film, the side surface of the second removal section being defined by the first boundary after the first removal section is removed.

10. The method of claim 2, further comprising providing an input sensing part onto the first area of the display panel, wherein
the providing of the window comprises disposing the window on the input sensing part, and
the anti-reflection layer is disposed between the input sensing part and the window on the first area of the display panel and extends to the bending area and the second area of the display panel.

11. The method of claim 1, wherein the attaching of the anti-reflection layer to the display panel comprises:
removing a second releasing film disposed below a first adhesive layer, the first adhesive layer being disposed under the anti-reflection layer; and
attaching the anti-reflection layer to the display panel by the first adhesive layer.

12. The method of claim 1, further comprising providing a driving IC (integrated circuit) onto the second area of the display panel, wherein
the attaching of the anti-reflection layer comprises disposing the anti-reflection layer spaced apart from the driving IC, and
the providing of the cover tape comprises providing the cover tape on the driving IC.

13. The method of claim 12, further comprising providing a printed circuit board, on which a timing controller is mounted, onto the second area of the display panel so that the printed circuit board is spaced apart from the driving IC,
wherein the providing of the cover tape comprises disposing the cover tape spaced apart from the timing controller and on a portion of the printed circuit board disposed on the second area of the display panel.

14. The method of claim 12, further comprising bending the bending area of the display panel so that the second area of the display panel is disposed below the first area of the display panel.

15. A display device comprising:
a display panel that comprises:
a first area;
a bending area extending from the first area; and
a second area extending from the bending area;
a driving IC (integrated circuit) disposed on the second area of the display panel;
an anti-reflection layer disposed on the first area of the display panel, extending to the bending area and the second area of the display panel, and spaced apart from the driving IC; and
a cover tape disposed on the driving IC and a first section of the anti-reflection layer that overlaps the second area of the display panel,
wherein an edge of the cover tape adjacent to the bending area of the display panel is spaced apart from a boundary between the bending area and the second area of the display panel.

16. The display device of claim 15, further comprising:
a printed circuit board; and
a timing controller disposed on the printed circuit board, wherein
a portion of the printed circuit board is spaced apart from the driving IC and disposed on the second area of the display panel, and
the cover tape is spaced apart from the timing controller and disposed on the portion of the printed circuit board disposed on the second area of the display panel.

17. The display device of claim 15, further comprising:
a panel protective film disposed under the display panel and including an opening portion overlapping the bending area of the display panel;
an input sensing part disposed directly on the first area of the display panel; and
a window disposed on the input sensing part,
wherein the anti-reflection layer is disposed between the input sensing part and the window on the first area of the display panel and extends to the bending area and the second area of the display panel.

18. The display device of claim 15, wherein the first area of the display panel comprises:
a pixel layer; and
a thin film encapsulation layer disposed on the pixel layer and overlapping the pixel layer,
wherein the anti-reflection layer is disposed on the thin film encapsulation layer and extends to the bending area of the display panel in a stepped manner.

19. A method for manufacturing a display device, the method comprising:
preparing a display panel that comprises a first area, a bending area extending from the first area, and a second area extending from the bending area;
disposing, on the display panel, a carrier film that comprises an anti-reflection layer and a first releasing film disposed on the anti-reflection layer;
cutting a first boundary between a first removal section of the first releasing film overlapping the second area of the display panel in a plan view and a second removal section of the first releasing film overlapping both the first area and the bending area of the display panel in a plan view by irradiating a laser beam to the first boundary;
removing the first removal section;
providing a cover tape onto a first section of the anti-reflection layer that overlaps the second area of the display panel in a plan view;
removing the second removal section of the first releasing film; and
providing a window onto a second section of the anti-reflection layer that overlaps the first area of the display panel in a plan view.

* * * * *